(12) United States Patent
Lee et al.

(10) Patent No.: US 6,744,096 B2
(45) Date of Patent: Jun. 1, 2004

(54) NON-VOLATILE MEMORY DEVICE HAVING A BIT LINE CONTACT PAD AND METHOD FOR MANUFACTURING THE SAME

(75) Inventors: Seung-Min Lee, Gyeonggi-do (KR); Byung-Hong Chung, Gyeonggi-do (KR)

(73) Assignee: Samsung Electronics, Co., Ltd., Kyungki-do (KR)

( * ) Notice: Subject to any disclaimer, the term of this patent is extended or adjusted under 35 U.S.C. 154(b) by 0 days.

(21) Appl. No.: 10/453,943

(22) Filed: Jun. 4, 2003

(65) Prior Publication Data

US 2003/0216001 A1 Nov. 20, 2003

Related U.S. Application Data

(62) Division of application No. 10/072,577, filed on Feb. 6, 2002, now Pat. No. 6,593,190.

(30) Foreign Application Priority Data

Feb. 19, 2001 (KR) .......................................... 2001-8114

(51) Int. Cl.$^7$ .............................................. H01L 29/788
(52) U.S. Cl. ...................................... 257/316; 257/773
(58) Field of Search ................................ 257/316, 773, 257/775, 382

(56) References Cited

U.S. PATENT DOCUMENTS 6,593,190 B2 * 7/2003 Lee et al. .................... 438/262

* cited by examiner

Primary Examiner—Mark V. Prenty
(74) Attorney, Agent, or Firm—F. Chau & Associates, LLC

(57) ABSTRACT

A non-volatile memory device and a method for manufacturing the same are disclosed. A non-volatile memory device comprises a semiconductor substrate having active areas which extend in a first direction and are repeatedly arranged in a second direction orthogonal to the first direction, a plurality of word lines formed on the semiconductor substrate which extending in the second direction while being repeatedly arranged in the first direction, string select lines adjacent to a first word line and extending in the second direction, ground select lines adjacent to a last word line and extending in the second direction, a first insulating interlayer formed on the resultant structure and comprising a first opening exposing the active area between the ground select lines and a second opening exposing the active area between the string select lines, a bit line contact pad formed in the second opening. A sidewall of the contact pad comprises a negative slope in the first direction and a positive slope in the second direction. A hard mask layer pattern, having the same pattern size as the active area, is formed on the contact pad and the first insulating interlayer. A second insulating interlayer is formed on the hard mask layer pattern and the first insulating interlayer. The second insulating interlayer has a bit line contact hole on the contact pad and thus the process margin is sufficiently achieved.

7 Claims, 23 Drawing Sheets

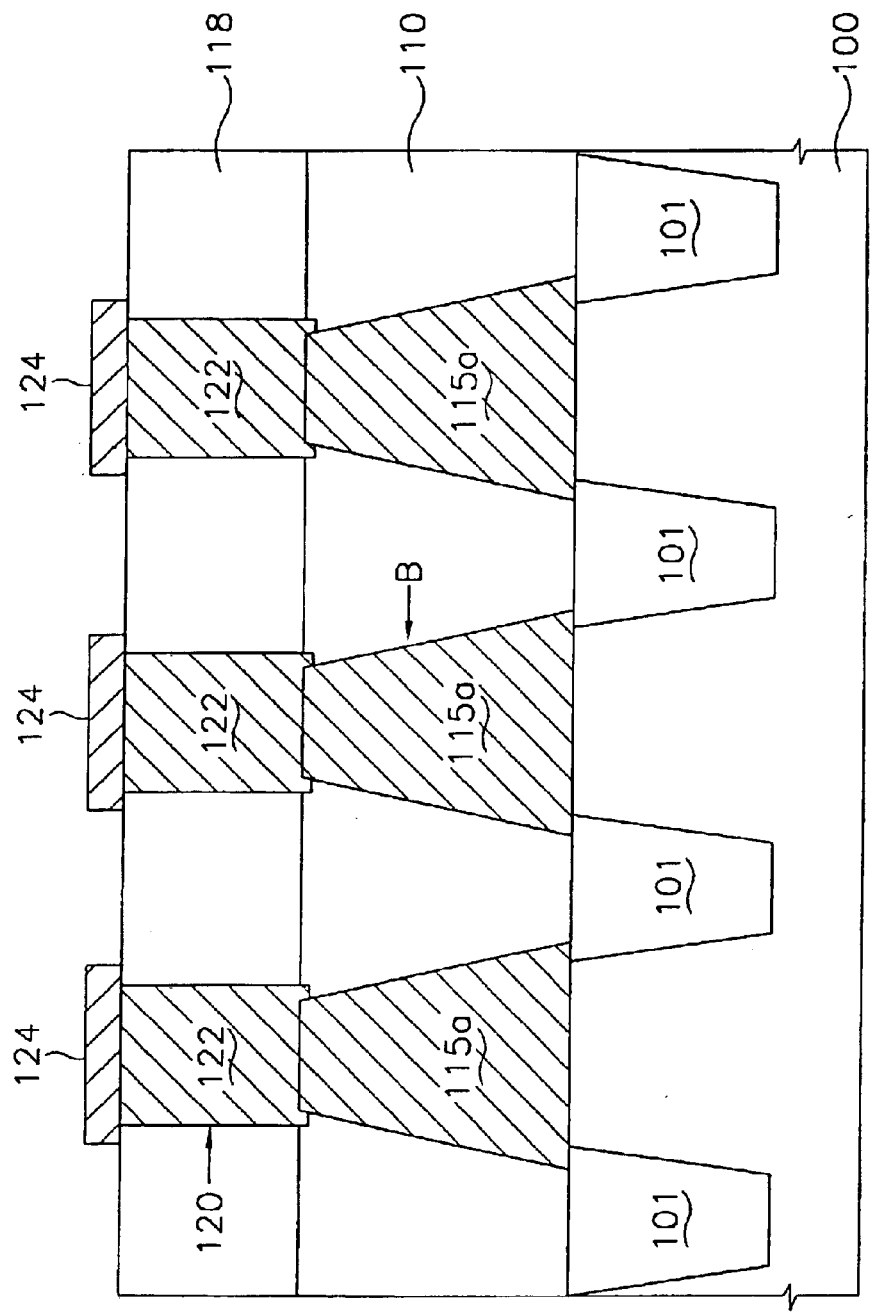

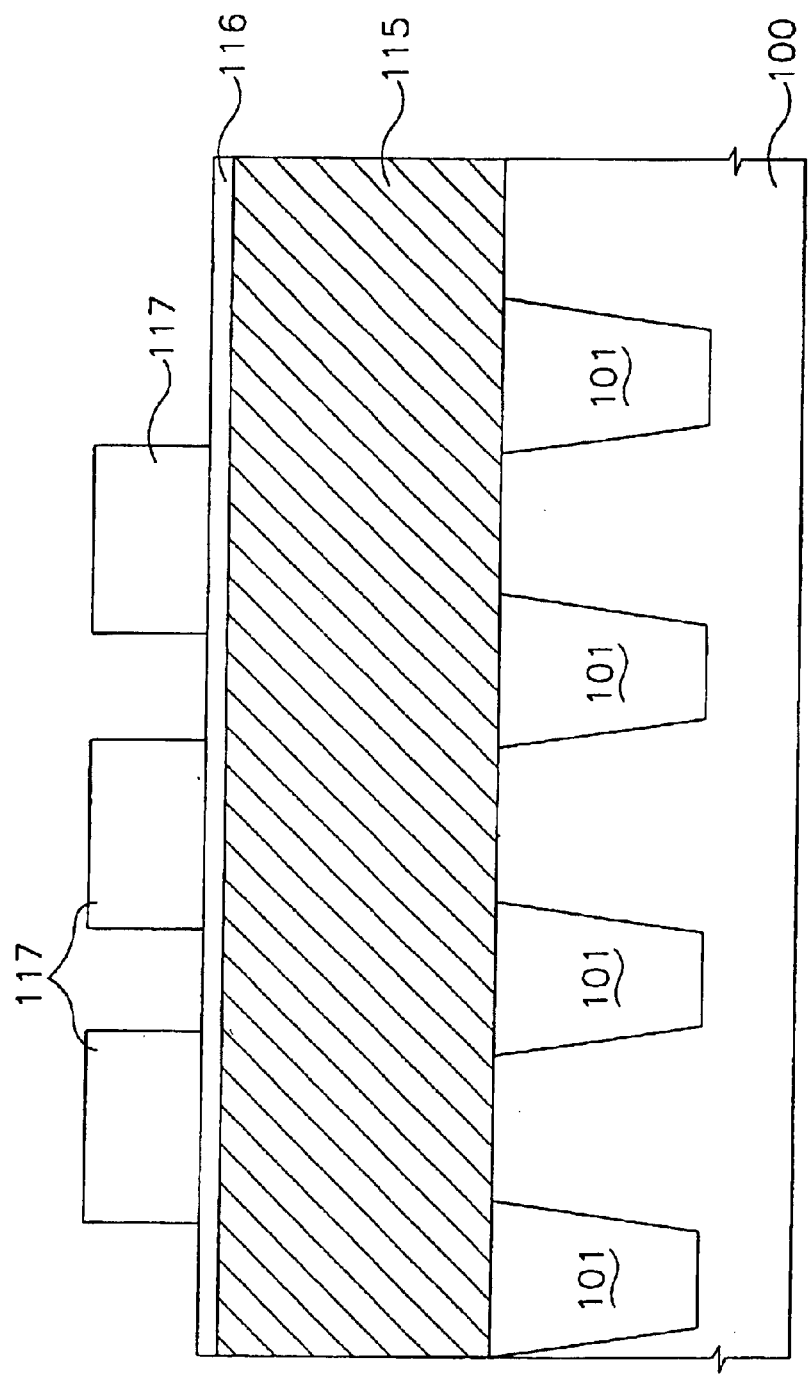

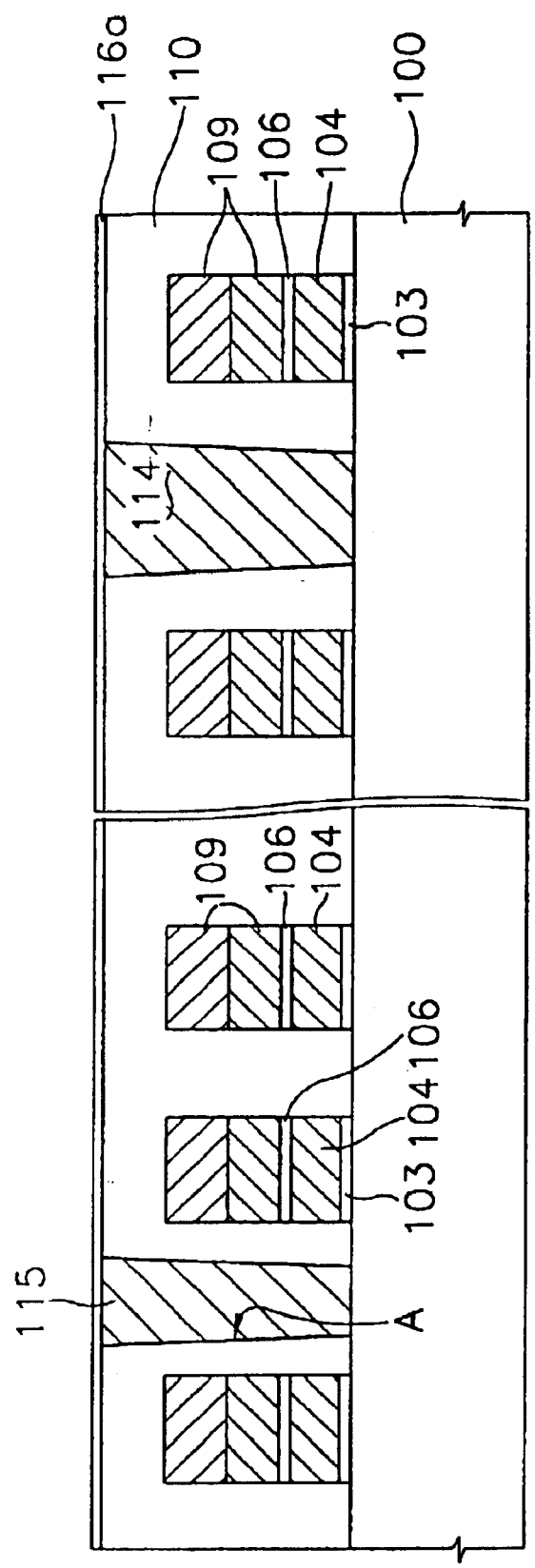

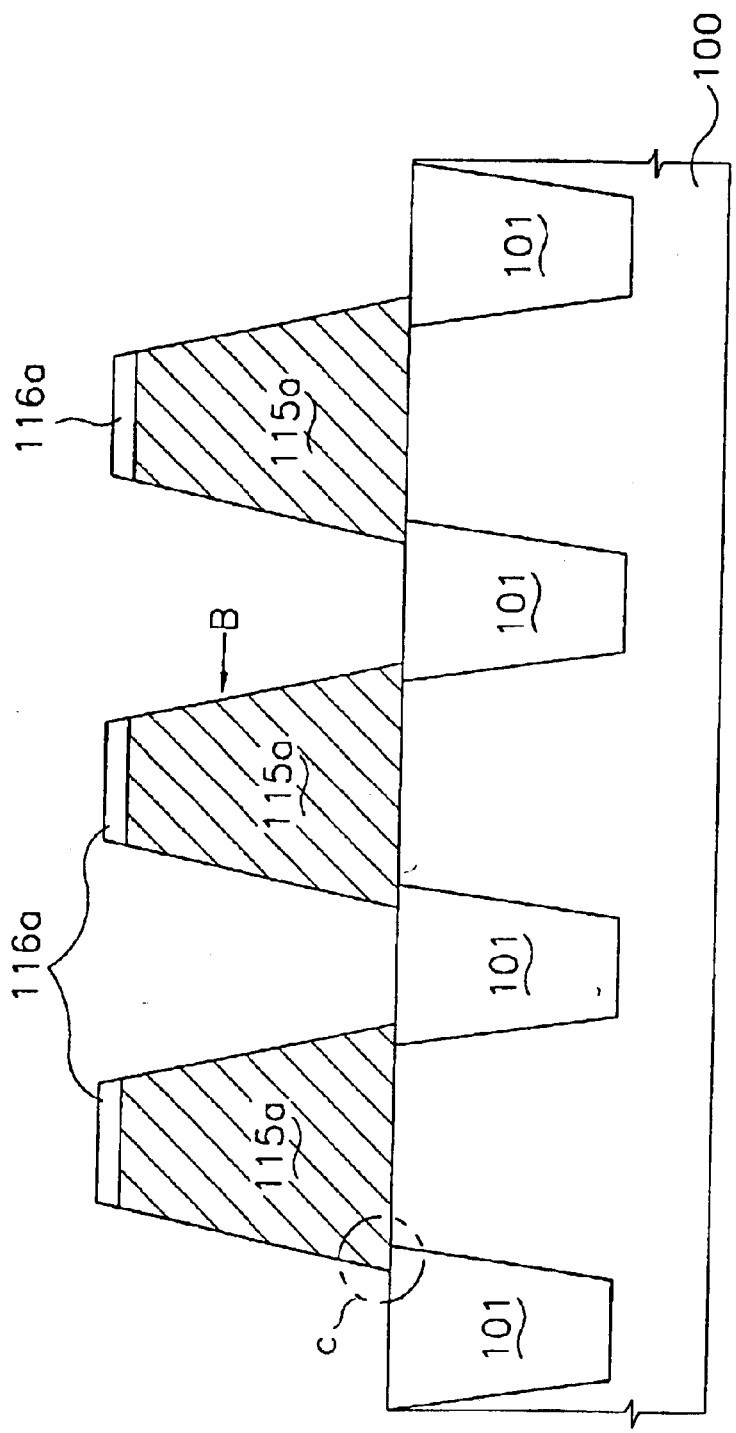

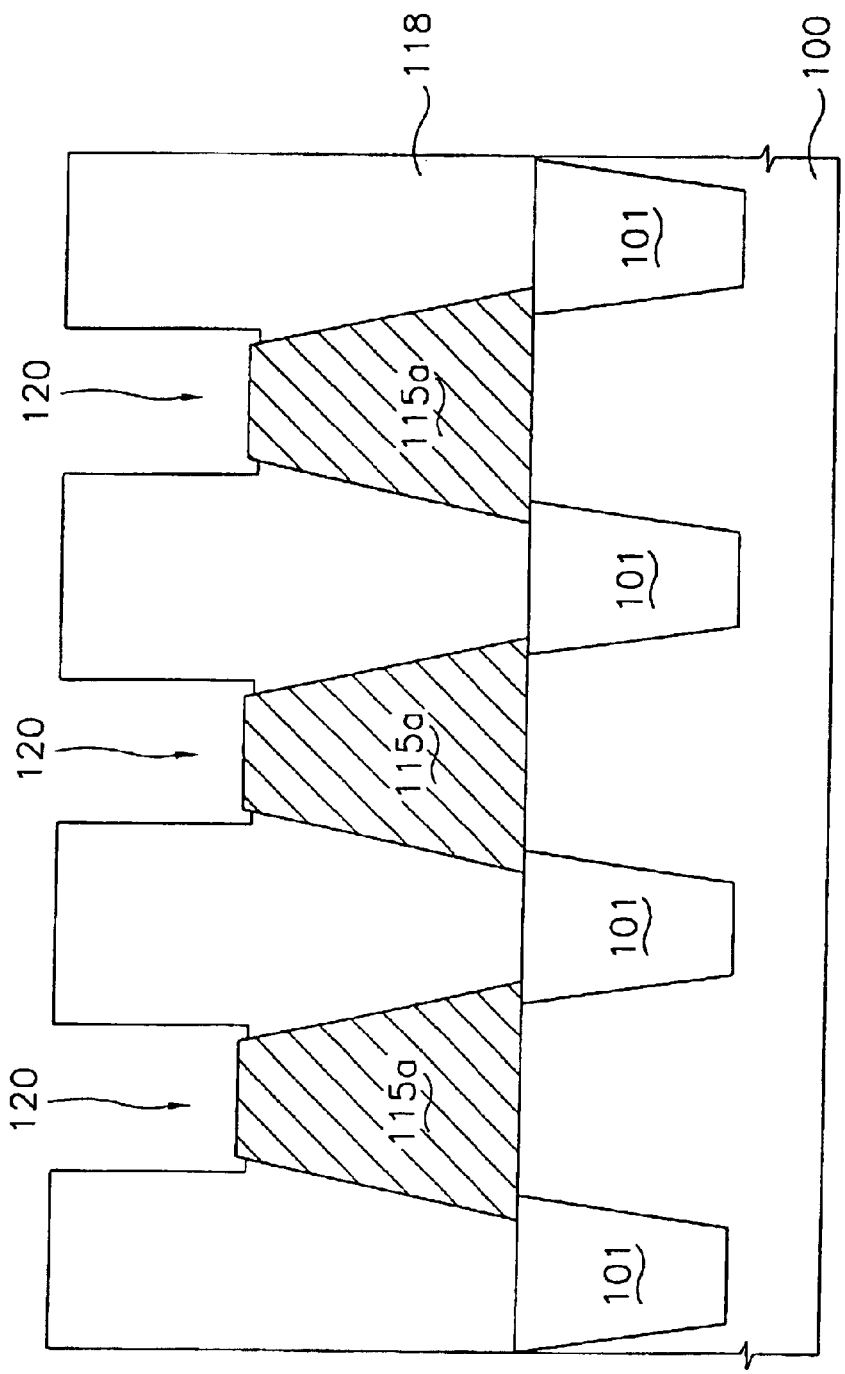

NON-VOLATILE MEMORY DEVICE HAVING A BIT LINE CONTACT PAD AND METHOD FOR MANUFACTURING THE SAME

CROSS-REFERENCE TO RELATED APPLICATION

This application is a divisional of U.S. application Ser. No. 10/072,577 filed on Feb. 6, 2002, now U.S. Pat. No. 6,593,190 the disclosure of which in its entirety is incorporated by reference herein.

This application claims priority to Korean Application No. 2001-8114 filed on Feb. 19, 2001.

BACKGROUND

1. Technical Field

The present invention relates to a semiconductor device and a method for manufacturing the same, and more particularly, to a non-volatile memory device comprising a bit line contact pad and a method for manufacturing the same.

2. Description of Related Art

In general, semiconductor memory devices include RAM devices and ROM devices. In RAM devices such as a DRAM (dynamic random access memory) and an SRAM (static random access memory), data is rapidly input/output to/from the RAM devices and the data is volatilized as time lapses. In contrast, ROM devices persistently maintain the data, but the data is slowly input/output to/from ROM devices. Examples of ROM devices include, for example, EEPROMs (electrically erasable and programmable ROMs) that are capable of electrically inputting/outputting data, and flash memory devices. A flash memory device is a type of advanced EEPROM, in which the input and output of data is electrically controlled by an F-N (Fowler-Nordheim) tunneling or a hot electron injection.

Flash memory devices generally include NAND-type flash memory devices and NOR-type flash memory devices. NAND-type flash memory devices comprise a plurality of cell transistors connected to each other in series for forming a unit string (which is connected between a bit line and a ground line in a row), and are used for high integration designs. In NOR-type flash memory devices, each cell transistor is connected between a bit line and a ground line in a row. NOR-type flash memory devices are used for high-speed operation. FIGS. 1A to 1C are sectional views of NAND-type flash memory devices manufactured according to a conventional method.

Referring to FIG. 1A, a tunnel oxide layer 12 (gate oxide layer) is formed on a semiconductor substrate 10 having a field area and an active area formed using a conventional isolation process. After depositing a first polysilicon layer 14 for a floating gate on the substrate, the first polysilicon layer 14 formed on the field area is etched using a photolithography process. Then, an ONO dielectric interlayer 16 and a second polysilicon layer 18 and tungsten silicide layer 19 (which comprise a control gate 20) are sequentially formed on the first polysilicon layer 14. Then, the tungsten silicide layer 19, the second polysilicon layer 18, the ONO dielectric interlayer 16 and the first polysilicon layer 14 are isotropically etched in sequence through a self-aligned etching process, thereby forming the gates of a memory cell transistor and a selective transistor.

After depositing an oxide film on the resulting structure to form a first insulating interlayer 22, the first insulating interlayer 22 is etched by using the photolithography process to form an opening 24 for a common source line (CSL). That is, the opening 24 exposes an active area formed between ground select lines (GSL).

After depositing a polysilicon layer in the opening 24 and on the first insulating interlayer 22, an etch-back process or a chemical mechanical polishing (CMP) process is performed to remove the polysilicon layer until the surface of the first insulating interlayer 22 is exposed. As a result, the common source line 26 is formed in the opening 24.

Continuing with reference to FIG. 1B, an oxide film is deposited on an entire surface of the resulting structure having the common source line 26 to form a second insulating interlayer 28. Then, the second insulating interlayer 28 is etched through a photolithography process to form a bit line contact hole 30 for connecting an active area to a bit line. That is, the bit line contact hole 30 exposes the active area formed between string select lines (SSL).

Referring to FIG. 1C, after depositing a polysilicon layer in the bit line contact hole 30 and on the second insulating interlayer 28, a bit line plug 32 for filling the bit line contact hole 30 is formed by removing the polysilicon layer until the surface of the second insulating interlayer 28 is exposed through an etch-back process or a CMP process. Then, a metal material, such as tungsten, is deposited on the bit line plug 32 and the second insulating interlayer 28. Thereafter, the metal material layer is patterned with a photolithography process, thereby forming a bit line 34 which contacts with the bit line plug 32.

There are disadvantages associated with the conventional method described above. For instance, a gap margin between the string select lines becomes insufficient for forming a bit line contact hole 30 (which connects an active area to a bit line), as the design rule is reduced. Further, a gap between the bit line contact holes is so densely formed that a bridge can be created between adjacent bit lines. Furthermore, a contact resistance is increased due to a fine bit line contact hole 30. There is a need, therefore, for a method for manufacturing a non-volatile device that can solve the above disadvantages.

SUMMARY OF THE INVENTION

It is an object of the present invention to provide a non-volatile memory device comprising a bit line contact hole formed on a bit line contact pad.

It is another object of the present invention to provide a method for manufacturing a non-volatile memory device in which a bit line contact hole is formed after forming a bit line contact pad so as to ensure a sufficient process margin for the bit line contact hole.

According to one aspect of the present invention, a non-volatile memory device comprises: a plurality of word lines formed on a semiconductor substrate having active areas, wherein the active areas are spaced by field areas and extend in a first direction while being repeatedly arranged in a second direction orthogonal to the first direction, wherein the plurality of word lines extend in the second direction while being repeatedly arranged in the first direction; string select lines which are adjacent to a first word line among the word lines and extend in the second direction and ground select lines which are adjacent to a last word line among the word lines and extend in the second direction; a first insulating interlayer formed on the word lines, the string select lines, the ground lines and the semiconductor substrate and comprising a first opening for partially exposing the active area formed between the ground select lines and a second opening for partially exposing the active area formed between the string select lines; a bit line contact pad formed in the second opening, a sidewall of the bit line contact pad comprising a negative slope in the first direction and a positive slope in the second direction; a hard mask layer pattern formed on the bit line contact pad and the first insulating interlayer and patterned in a same size as the active area; and a second insulating interlayer formed on the hard mask layer pattern and the first insulating interlayer and comprising a bit line contact hole for partially exposing the bit line contact pad.

According to another aspect of the present invention, a method for manufacturing a non-volatile memory device comprises the steps of: forming field areas and active areas on a semiconductor substrate such that the active areas are spaced by the field areas and extending in the a first direction while being repeatedly arranged in a second direction which is orthogonal to the first direction; forming a plurality of word lines, string select lines and ground select lines on the semiconductor substrate formed with the active areas, the word lines extending in the second direction while being repeatedly arranged in the first direction, the string select lines being adjacent to a first word line among the word lines and extending in the second direction, and the ground select lines being adjacent to a last word line among the word lines and extending in the second direction; forming a first insulating interlayer on the word lines, the string select lines, the ground select lines and the semiconductor substrate; etching the first insulating interlayer to form a first opening which partially exposes the active area formed between the ground select lines and extends in the second direction, and to form a second opening which partially exposes the active areas formed between the string select lines and extends in the second direction; forming a common source line in the first opening and a pad line in the second opening, simultaneously; forming a hard mask layer pattern on the common source line, the pad line, and the first insulating interlayer, the hard mask pattern being patterned in a same size as the active area; forming a bit line contact pad by slantingly etching the pad line using the hard mask layer pattern such that a sidewall of the bit line contact pad has a negative slope in the first direction and a positive slope in the second direction; forming a second insulating interlayer on the bit line contact pad and the first insulating interlayer; and etching the second insulating interlayer to form a bit line contact hole for partially exposing the bit line contact pad.

According to further aspect of the present invention, a method for manufacturing a non-volatile memory device comprises the steps of: forming field areas and active areas on a semiconductor substrate such that the active areas are spaced by the field areas and extending in the a first direction while being repeatedly arranged in a second direction which is orthogonal to the first direction; forming a plurality of word lines, string select lines and ground select lines on the semiconductor substrate formed with the active areas, the word lines extending in the second direction while being repeatedly arranged in the first direction, the string select lines being adjacent to a first word line among the word lines and extending in the second direction, and the ground select lines being adjacent to a last word line among the word lines and extending in the second direction; forming a first insulating interlayer on the word lines, the string select lines, the ground select lines and the semiconductor substrate; etching the first insulating interlayer to form a first opening which partially exposes the active area formed between the ground select lines and extends in the second direction, and to form a second opening which partially exposes the active areas formed between the string select lines and extends in the second direction; forming a common source line in the first opening and a pad line in the second opening, simultaneously; forming a hard mask layer pattern on the common source line, the pad line, and the first insulating interlayer, the hard mask pattern being patterned in a same size as the active area; forming a bit line contact pad by slantingly etching the pad line using the hard mask layer pattern such that a sidewall of the bit line contact pad has a negative slope in the first direction and a positive slope in the second direction; forming a second insulating interlayer on the bit line contact pad and the first insulating interlayer; forming a bit line insulating layer, which extends in the first direction while being repeatedly arranged in the second direction, on the second insulating interlayer; and forming a bit line contact hole by partially etching the second insulating interlayer formed on the bit line contact pad and simultaneously forming a metal contact hole by partially etching the second insulating interlayer formed on the common source line.

Preferably, when the common source line is formed, a pad line (which extends in the direction identical to the extending direction of the active areas) is formed on the bit line contact hole area. Then, the hard mask layer pattern having a pattern size identical to the size of the active area is formed on the pad line. The pad line is partially etched by using the hard mask layer pattern as an etching mask, so that the bit line contact pad is formed only on the active area to which the bit line is connected.

Advantageously, because the bit line contact hole is formed on the bit line contact pad, a misalign margin is sufficiently ensured when a photolithography process is performed for forming the bit line contact hole. In addition, when the photolithography process is performed, an etch margin is ensured by the stepped portion of the insulating interlayer.

These and other aspects, features and advantages of the present invention will be described and become apparent from the following detailed description of preferred embodiments, which is to be read in connection with the accompanying drawings.

BRIEF DESCRIPTION OF THE DRAWINGS

FIGS. 3A and 3B are sectional views of a NAND type flash memory device, taken along the lines Y–Y' and X–X' of FIG. 2, respectively.

FIGS. 6A and 6B are sectional views of a NAND-type flash memory device illustrating a step for forming a hard mask layer of a NAND-type flash memory device according to an embodiment of the present invention.

FIGS. 7A and 7B are sectional views of a NAND-type flash memory device illustrating a step for forming a bit line contact pad of a NAND-type flash memory device according to an embodiment of the present invention.

FIGS. 8A and 8B are sectional views of a NAND-type flash memory device illustrating a step for forming a bit line contact hole of a NAND-type flash memory device according to an embodiment of the present invention.

DETAILED DESCRIPTION OF PREFERRED EMBODIMENTS

Figure 1A:
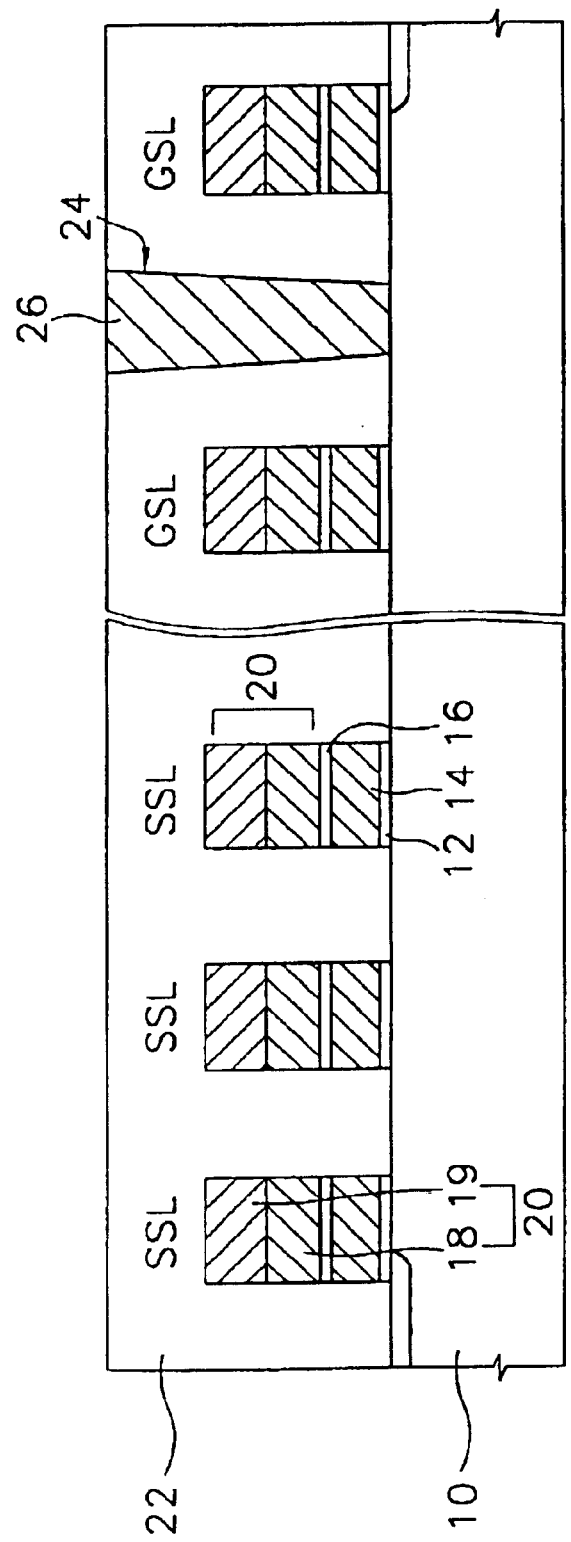
FIGS. 1A to 1C are sectional views of a NAND-type flash memory device illustrating a conventional method for manufacturing a NAND-type flash memory device.
Figure 1B:
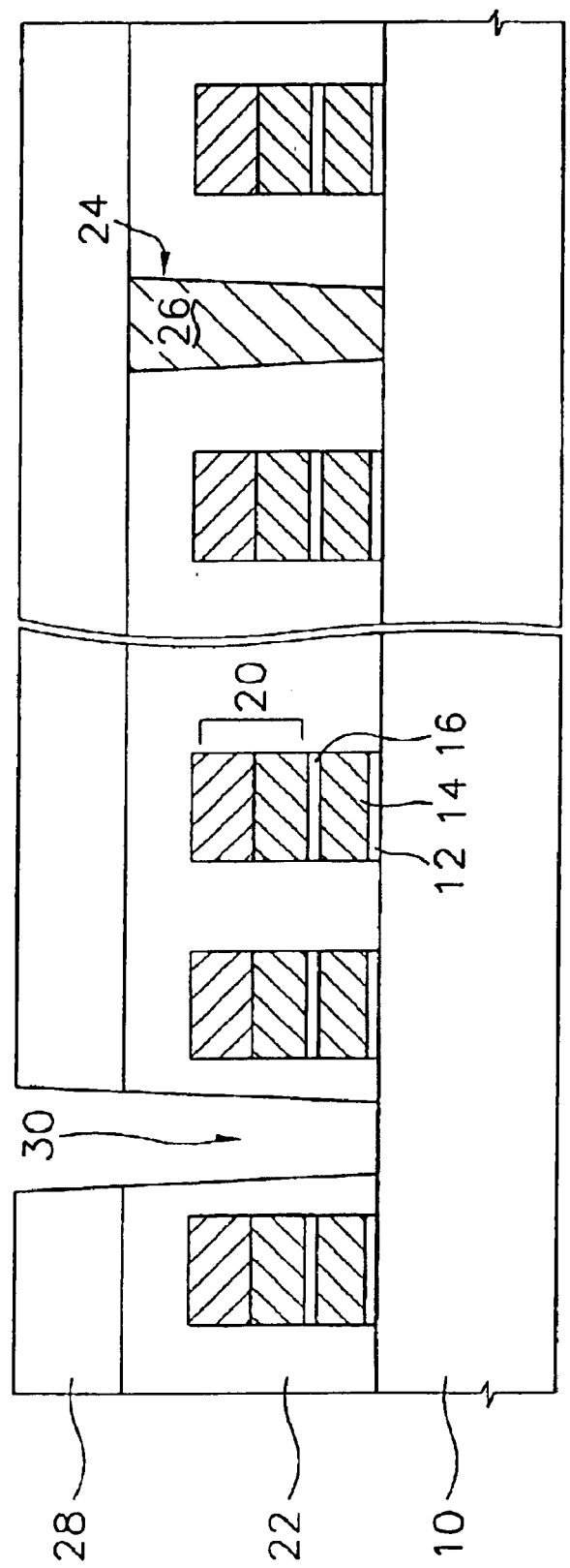
Figure 1C:
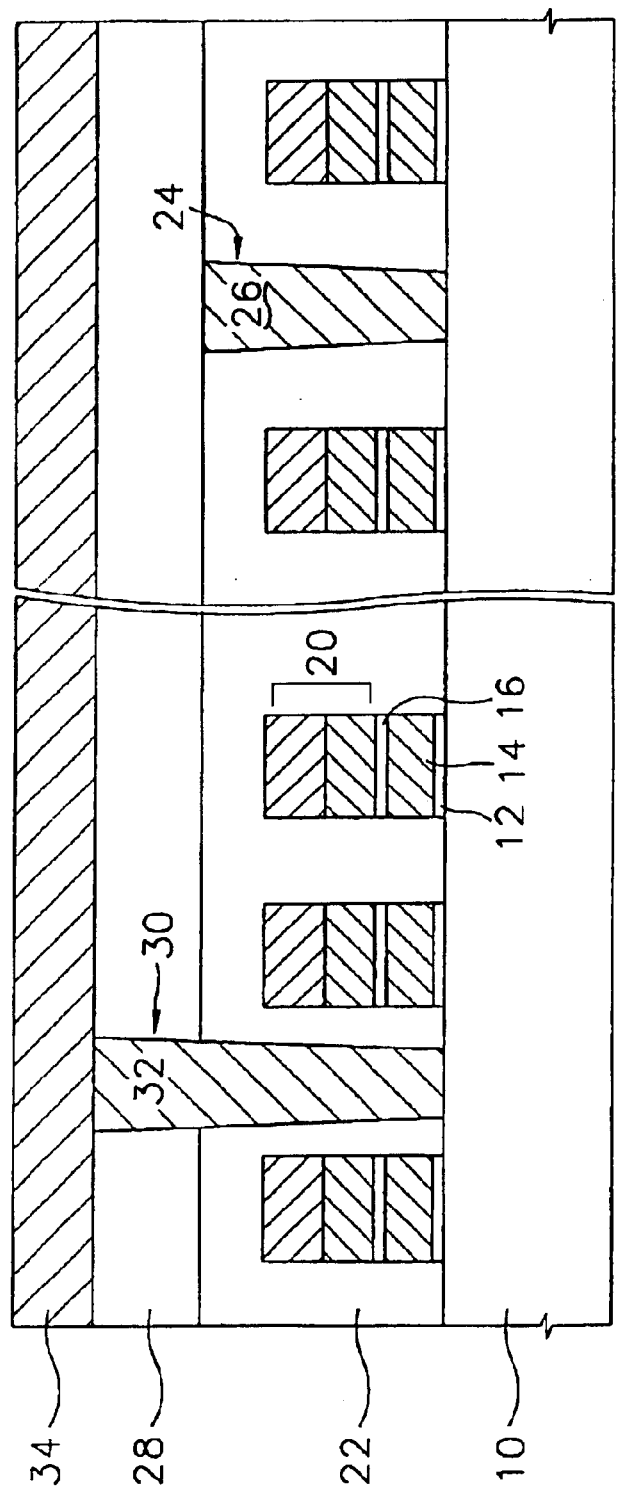
Figure 2:
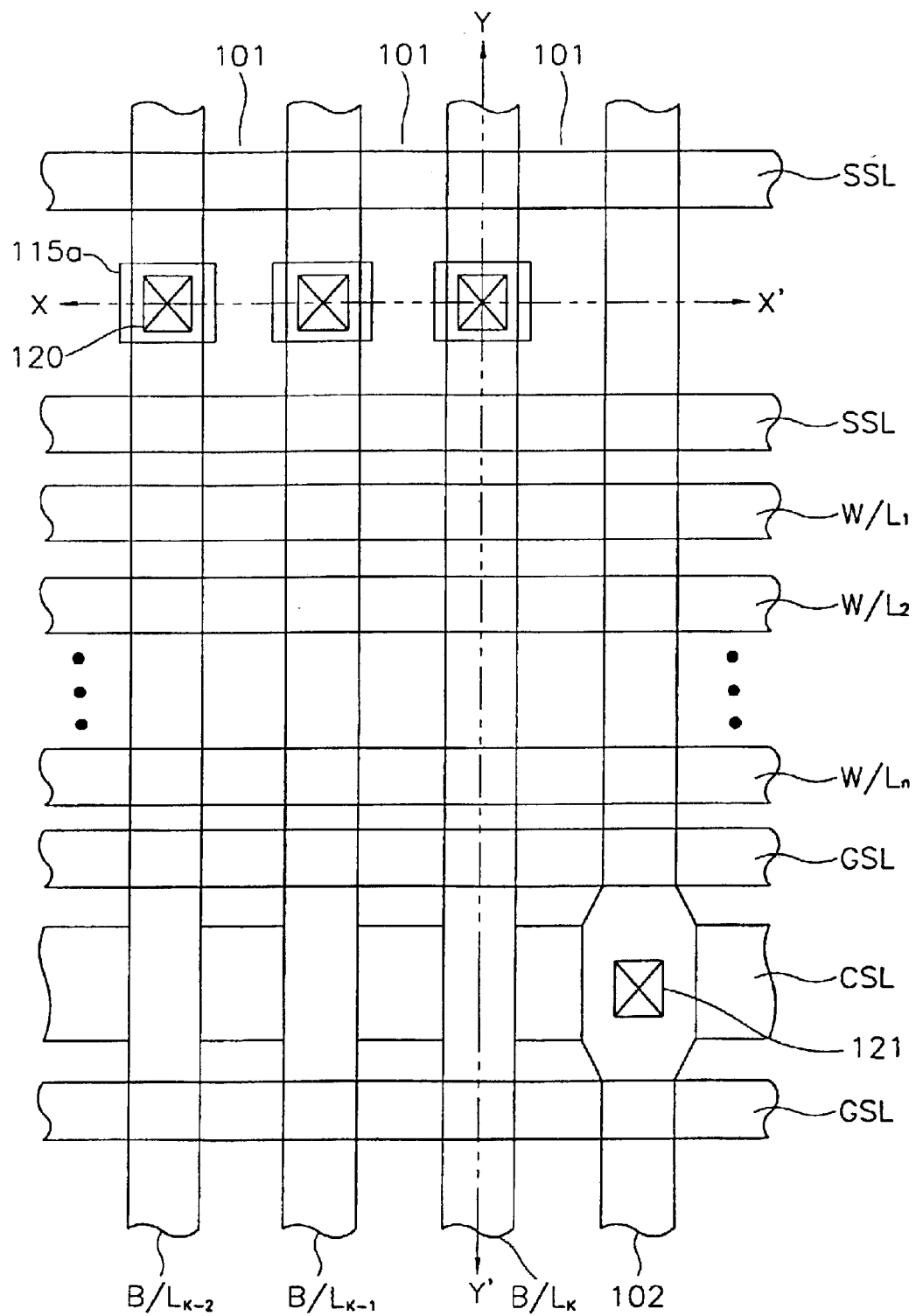
FIG. 2 is a layout of a NAND type flash memory cell according to an embodiment of the present invention.
Figure 3A:
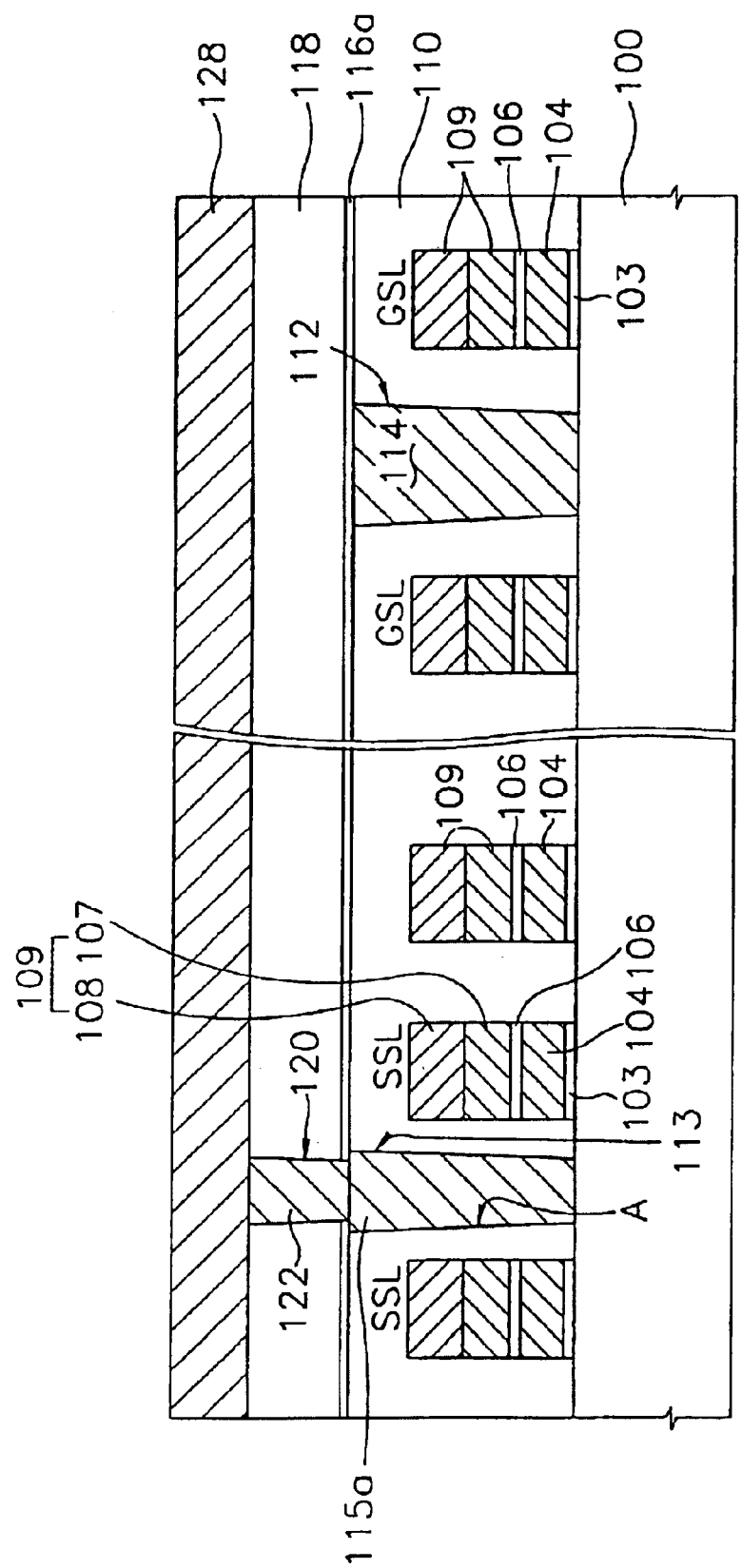

FIG. 2 is a layout of a NAND type flash memory cell manufactured according to an embodiment of the present invention, and FIGS. 3A and 3B are sectional views of the NAND type flash memory cell taken along the lines Y–Y' and X–X' of FIG. 2, respectively.

Referring to FIGS. 2, 3A and 3B, active areas 102 (that are used for a channel and a source/drain of a memory cell transistor) are spaced by field areas 101 on a semiconductor substrate 100. The active areas 102 extend in a Y-axial direction in parallel to each other while being repeatedly arranged in an X-axial direction. A plurality of word lines $(W/L_1, W/L_2 \ldots W/L_n)$ are arranged on the active areas 102, so that memory cell transistors having a stack gate structure (which comprise a floating gate 104 and a control gate 109, respectively) are formed. The word lines extend in the X-axial direction while being repeatedly arranged in the Y-axial direction. Highly doped source/drain areas are formed in surface portions of the active areas 102 exposed between the word lines $(W/L_1, W/L_2 \ldots W/L_n)$.

When a plurality of memory cell arrays arranged in the X-Y direction are formed by the aligning the active areas 102 extending in the Y-axial direction and the word lines $(W/L_1, W/L_2 \ldots W/L_n)$ extending in the X-axial direction, string select lines (SSL) and ground select lines (GSL) (which are select transistors) are provided at outer portions of a first word line $W/L_1$ and an $n_{th}$ word line $W/L_n$, respectively. Accordingly, a "string" is formed as a memory unit, wherein a plurality of memory cell transistors are connected in series while sharing the source/drain areas.

To prevent a signal delay caused by resistance, the select transistors, comprising the string select lines (SSL) and the ground select lines (GSL), comprise a butting contact hole (not shown) for connecting the floating gate 104 and the control gate 109 on the field areas 101 formed between each input/output (I/O), respectively. Therefore, each of the select transistors electrically operates as a MOS transistor having a single layer gate.

A bit line contact hole 120 is provided between the string select lines (SSL) (i.e., the hole 120 is provided on one outer portion of the string), and two strings share one bit line contact hole 120 in the form of mirror image. First and second insulating interlayers 110 and 118 are formed on the word lines $(W/L_1, W/L_2 \ldots W/L_n)$ to form a plurality of bit lines $(B/L_k, B/L_{k-1}, B/L_{k-2} \ldots )$. The bit lines extend in the Y-axial direction orthogonal to the word lines while being repeatedly arranged in the X-axial direction.

A common source line (CSL) 114, extending in the X-axial direction between the ground select lines (GSL), is provided on the other outer portion of the string. One metal contact hole 121 is formed on the common source line 114 corresponding to the plural bit lines. The common source line 114 is formed by filling a first opening 112 passing through the first insulating interlayer 110 and by being planarized to have a height identical to a height of the first insulating interlayer 110. The bit line contact hole 120 is not formed on a portion of the bit line to which the metal contact hole 121 is positioned.

In a preferred embodiment of the present invention, a second opening 113 passing through the first insulating interlayer 110 is formed so as to partially expose the active area formed between the string select lines (SSL). A bit line contact pad 115a is formed in the second opening 113 and is planarized to have a height preferably identical to the height of the first insulating interlayer 110. The bit line contact pad 115a comprises a sidewall (A) having a negative slope in the Y-axial direction and a sidewall (B) having a positive slope in the X-axial direction.

A hard mask layer pattern 116a, which is patterned in a size identical to the size of the active areas 102, is formed on the bit line contact pad 115a and the first insulating interlayer 110. The hard mask layer pattern 116a is used as a mask when the bit line contact pad 115 is patterned and is used as a stopper when an etching process is performed to form the bit line contact hole 120.

A second insulating interlayer 118, comprising the bit line contact hole 120 for partially exposing the bit line contact pad 115a, is formed on the hard mask layer pattern 116a and the first insulating interlayer 110. A bit line plug 122 is formed in the bit line contact hole 120, and a bit line 128 is formed on the bit line plug 122 and the second insulating interlayer 118. Accordingly, the bit line 128 is connected to the active area formed between the string select lines (SSL) through the bit line plug 122 and the bit line contact pad 115a.

FIGS. 4A to 11 are sectional and perspective views of a NAND-type flash memory device illustrating a method for constructing a NAND-type flash memory device according to an embodiment of the present invention. FIGS. 4A, 5A, 6A, 7A, 8A and 9A are sectional views of a NAND-type flash memory device taken along the line Y–Y' of FIG. 2, and FIGS. 4B, 5B, 6B, 7B, 8B and 9B are sectional views of a NAND-type flash memory device taken along the line X–X' of FIG. 2.

Figure 4A:
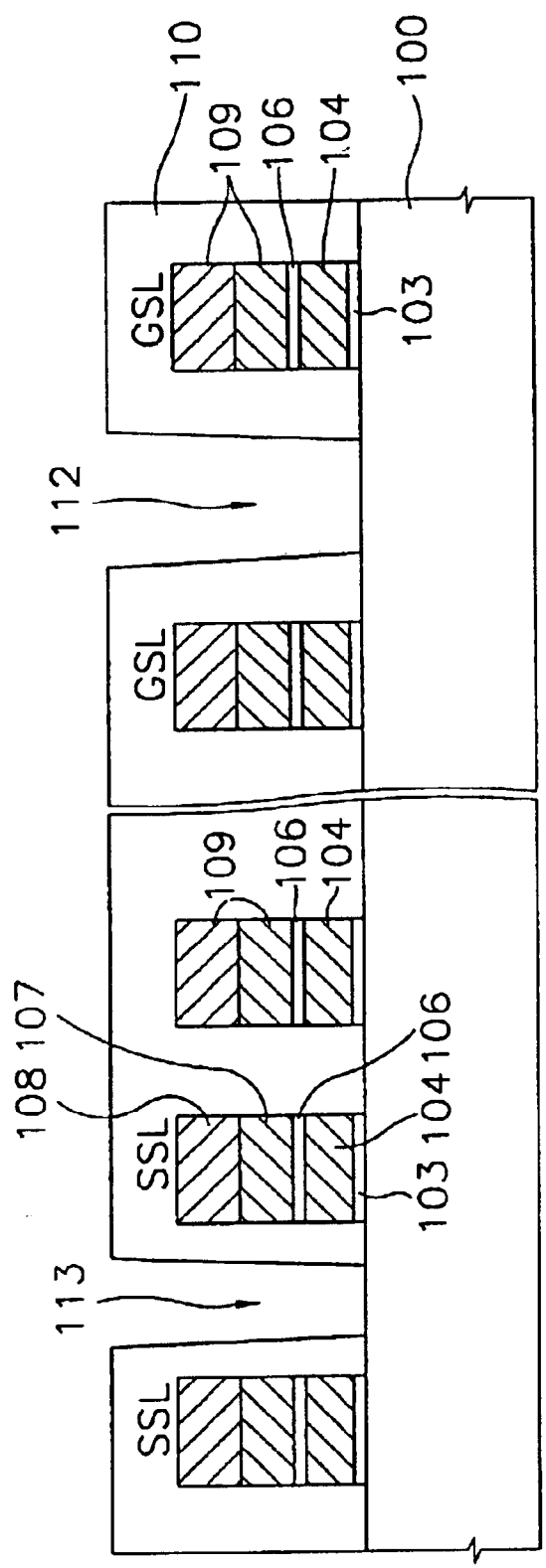
FIGS. 4A and 4B are sectional views of a NAND-type flash memory device illustrating steps for forming an insulating interlayer and openings of a NAND-type flash memory device according to an embodiment of the present invention.
Figure 4B:
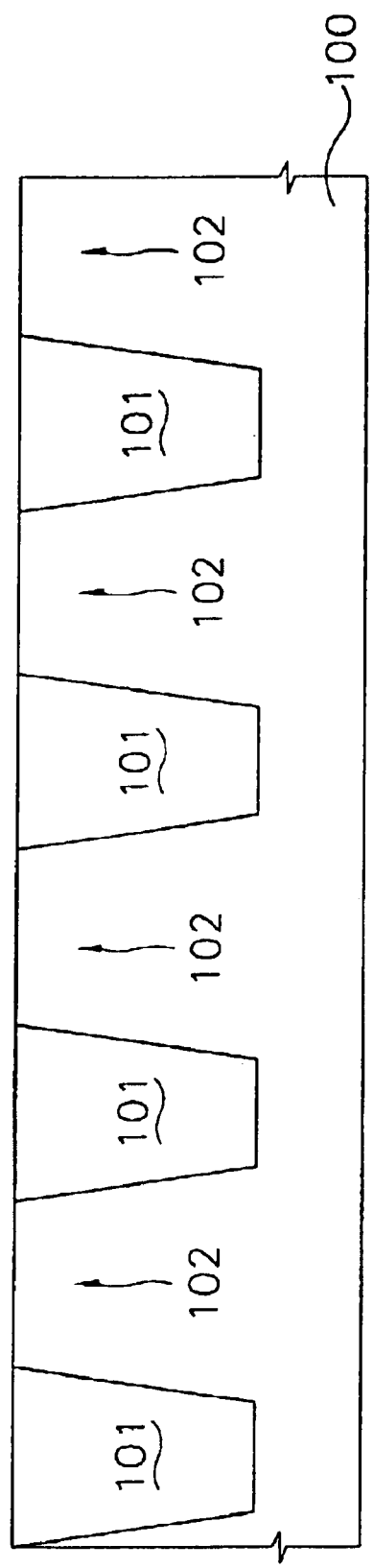

FIGS. 4A and 4B illustrate steps for forming a first insulating interlayer 110, and first and second openings 112 and 113 of a NAND-type flash memory device according to the invention. Field areas 101 (in FIG. 2) are formed on a semiconductor substrate 100 through a shallow trench isolation (STI) process, thereby defining active areas 102 (in FIG. 2) in the semiconductor substrate 100. Then, a tunnel oxide layer 103 (gate oxide layer) is formed on the active areas 102 through a thermal oxidation process. Alternatively, after growing the gate oxide layer on the semiconductor substrate 100, the gate oxide layer of the cell transistor is removed through a wet etching process, and then, the tunnel oxide layer 103 is formed such that the thickness of the gate oxide layer of a select transistor is different from the thickness of the gate oxide layer of a cell transistor.

Then, a first conductive layer (which is used for the floating gate of the cell transistor) is deposited on the resulting structure, and then, the first conductive layer formed on the field areas 101 is etched by performing a photolithography process. In addition, after forming a dielectric layer such as an ONO layer on the first conductive layer, a second conductive layer (which is used for the control gate of the cell transistor) is deposited on the dielectric layer. After opening a memory cell area by performing a photo process, the second conductive layer, the dielectric layer and the first conductive layer are dry-etched by performing a self-aligned etching process, thereby forming a stack gate of the cell transistor (that comprises the floating gate 104, a dielectric interlayer 106 and the control gate 109). At the same time, a string select transistor and a ground select transistor are formed. For instance, the floating gate 104 comprises doped polysilicon, and the control gate 109 comprises a polycide structure comprising sequentially stacked doped polysilicon layer 107 and tungsten silicide layer 108.

It is also possible to simultaneously define the active areas and the floating gate by applying a conventional self-aligned shallow trench isolation (SA-STI) process. In this case, a conductive layer for the floating gate is deposited again after the isolating process is performed to enlarge the area of the dielectric interlayer 106.

Then, after forming source/drain areas (not shown) of the cell transistor and the select transistors through a conventional ion implantation process, an oxide film such as a TEOS (tetraethylorthosilicate oxide) film is deposited on the resulting structure to form a first insulating interlayer 110. The first insulating interlayer 110 is formed to have a thickness of above 5000 Å such that the first insulating interlayer 110 has a thickness of about 2000 Å on the transistor.

After that, the first insulating interlayer 110 is etched through a photolithography process, to thereby form a first opening 112 for partially exposing the active area formed between adjacent ground select lines (GSL) and a second opening 113 for partially exposing the active area formed between adjacent string select lines (SSL). The first and second openings 112 and 113 extend in the X-axial direction.

Figure 5A:
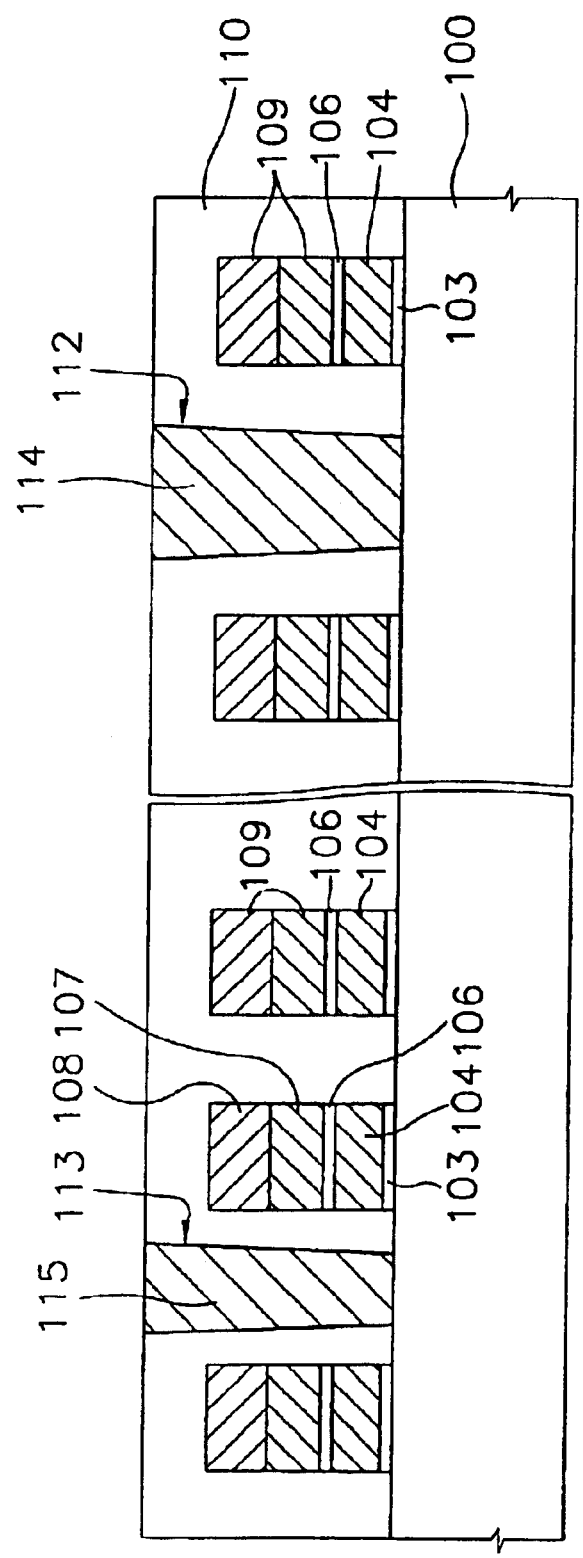
FIGS. 5A and 5B are sectional views of a NAND-type flash memory device illustrating steps for forming a common source line and a pad line of a NAND-type flash memory device according to an embodiment of the present invention.
Figure 5B:
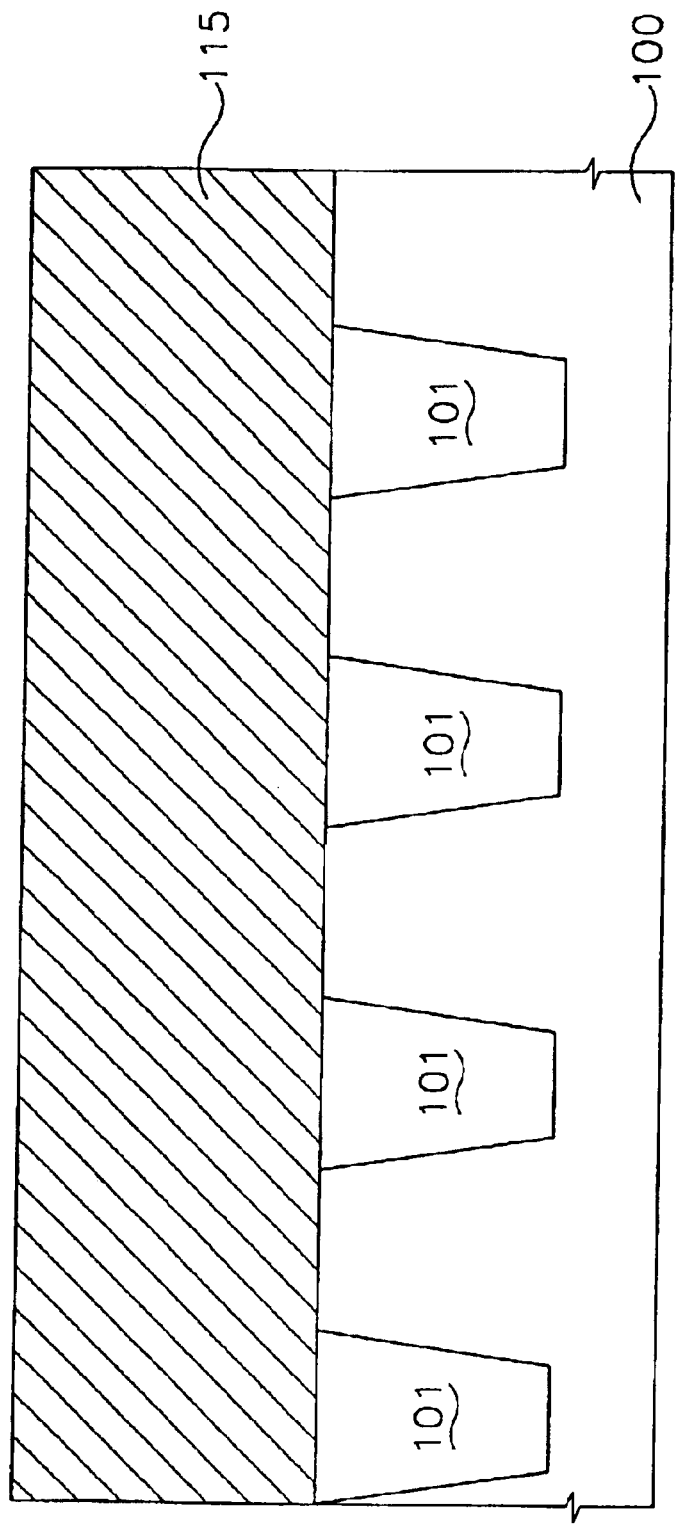

FIGS. 5A and 5B illustrate steps for forming a common source line 114 and a pad line 115. After depositing a conductive layer such as a doped polysilicon layer on the entire surface of the resulting structure (that comprises the first and second openings 112 and 113), the conductive layer is removed until the surface of the first insulating interlayer 10 is exposed by performing an etch-back process or a CMP process. As a result, the common source line 114 is formed in the first opening 112 and the pad line 115 is formed in the second opening 113. That is, the common source line 114 and the pad line 115 are planarized to have a height identical to the height of the first insulating interlayer 10.

Figure 6A:
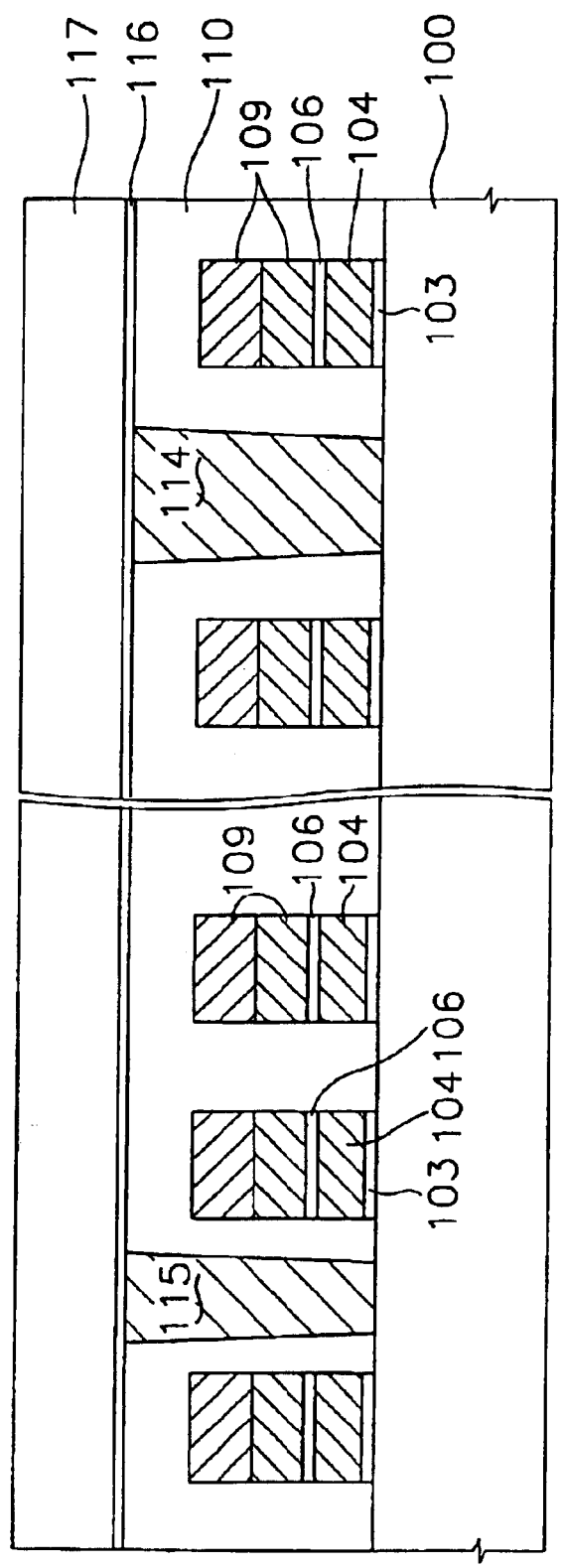

FIGS. 6A and 6B illustrate a step for forming a hard mask layer 116. As mentioned above, the hard mask layer 116 is formed by depositing insulating material such as SiN or SiON on the entire surface of the resulting surface (that comprises the common source line 114 and the pad line 115) to a thickness of about 300 to 1000 Å. For instance, the hard mask layer 116 comprises any one selected from the group comprising a nitride based film, an oxide based film, and a composite film of the nitride based film and the oxide based film. For instance, if the hard mask layer 116 comprises high temperature oxide (HTO) or PE-SiH$_4$, the thickness thereof is about 1000 to 3000 Å.

Then, after coating a photoresist layer on the hard mask layer 116, the photoresist layer is exposed and developed so that a photoresist pattern 117 is formed such that a misalign margin is ensured in the active areas 102. That is, the photoresist layer 117 is in the line-shaped form extending in the Y-axial direction and is formed only on an area to which the bit line contact hole is formed. At this time, an anti-reflective layer (not shown) may be formed on the hard mask layer 116 through a CVD process before the photoresist layer is coated on the hard mask layer 116. The anti-reflective layer comprises polysilicon, silicon oxide (e.g., high temperature oxide (HTO) and medium temperature oxide (MTO)), or silicon oxynitride (SiON). The anti-reflective layer prevents the light from reflecting from a lower substrate when a following photolithography process is performed, and allows the photoresist pattern to be easily formed.

FIGS. 7A and 7B illustrate a step for forming a bit line contact pad 115. By etching the hard mask layer 116 using the photoresist pattern 117, a hard mask layer pattern 116 is formed to be match with the size of the active area 102. Then, the pad line 115 is slantingly etched by using an etchant such as $Cl_2N_2$ or $Cl_2O_2$. The etchant has preferably the selectivity above 25:1 with respect to an oxide film. As a result, the bit line contact pad 115a is formed. The bit line contact pad 115a comprises a sidewall (A) having a negative slope in the Y-axial direction and a sidewall (B) having a positive slope in the X-axial direction.

Here, the positive slope indicates sidewall erosion by the appliance of the etchant while the negative slope indicates no sidewall erosion by the appliance of the etchant. That is, the sidewall (B) is bent outward to have a positive slope (which is eroded by an etchant introduced from above the substrate in the same manner as in the sidewall of a mesa structure) or to act as a buffer for the underlying layer when the etchant is applied.

In addition, the bit line contact pad 115 is overlapped with a predetermined part (C) of the fired area 101 in the X-axial direction to prevent the active area 102 (that is formed below the bit line contact pad 115a) from being etched when the bit line contact pad 115a is over-etched.

Figure 8A:
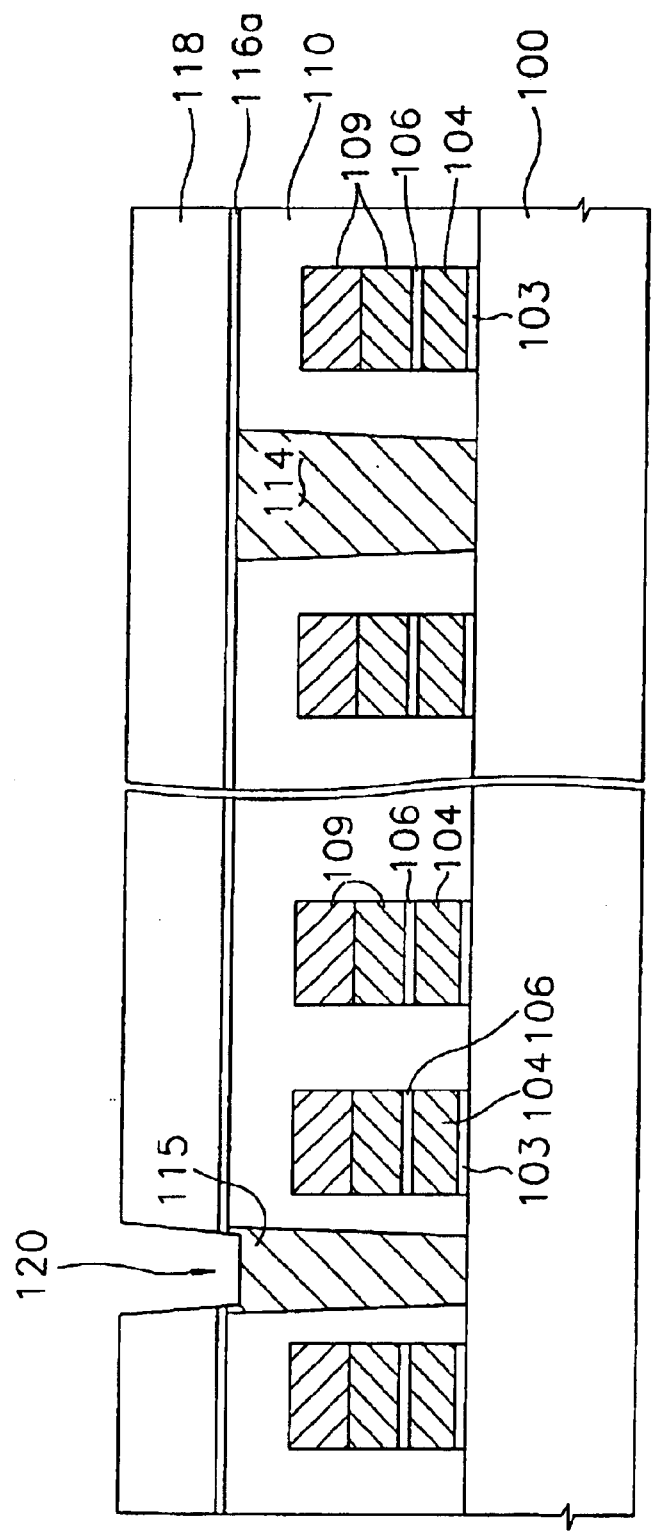

FIGS. 8A and 8B illustrate a step for forming a bit line contact hole 120. After removing the photoresist pattern through ashing and stripping processes, oxide based insulating material is deposited on the entire surface of the resulting structure to a thickness of about 2000 to 5000 Å so as to fill gaps formed between bit line contact pads 115, thereby forming a second insulating interlayer 118. For instance, high-density plasma is generated using $SiH_4$, $O_2$, and Ar gas as a plasma source, to thereby form the second insulating interlayer 118 comprising an HDP oxide film.

Then, a bit line contact hole 120 for exposing the bit line contact pad 115a is formed by etching the second insulating interlayer 118 through the photolithography process. At this time, an over-etching is performed to completely expose the bit line contact pad 115a.

Figure 9A:
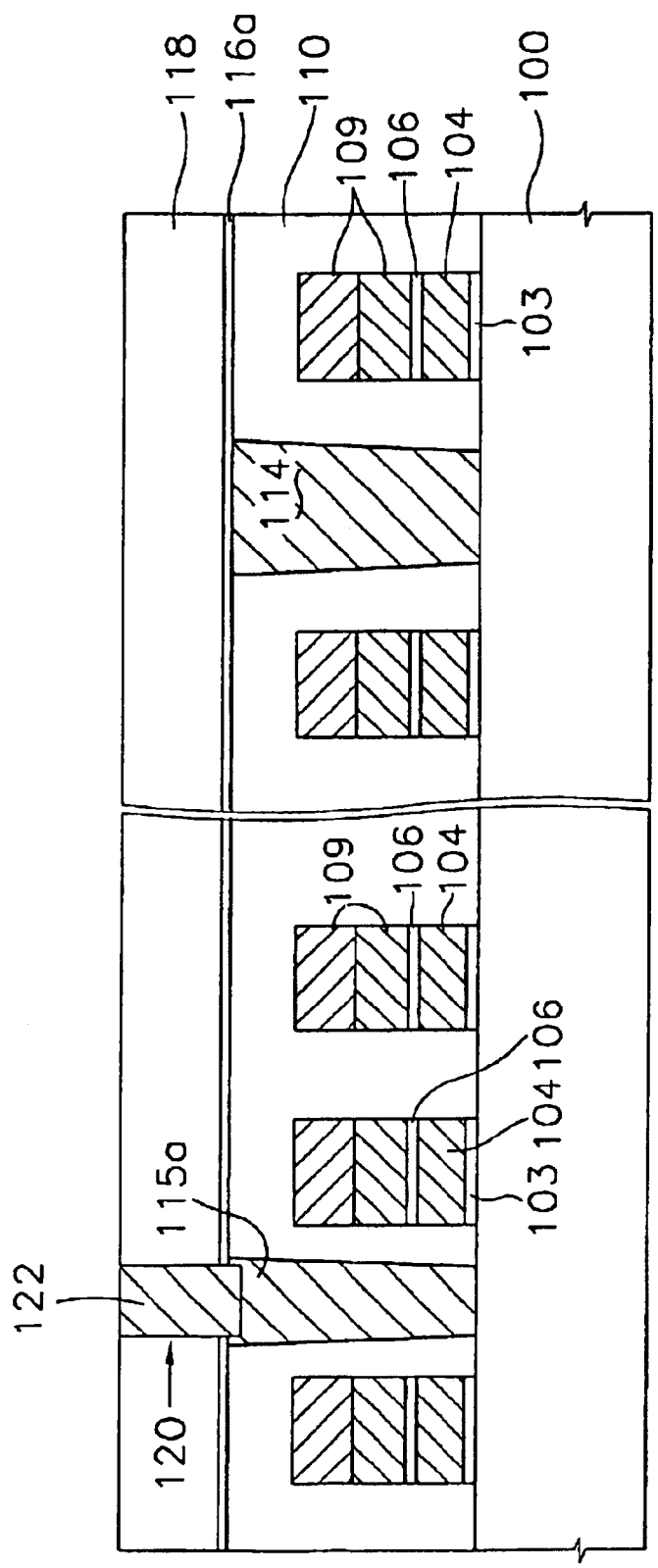
FIGS. 9A and 9B are sectional views of a NAND-type flash memory device illustrating a step for forming a bit line plug of a NAND-type flash memory device according to an embodiment of the present invention.
Figure 9B:
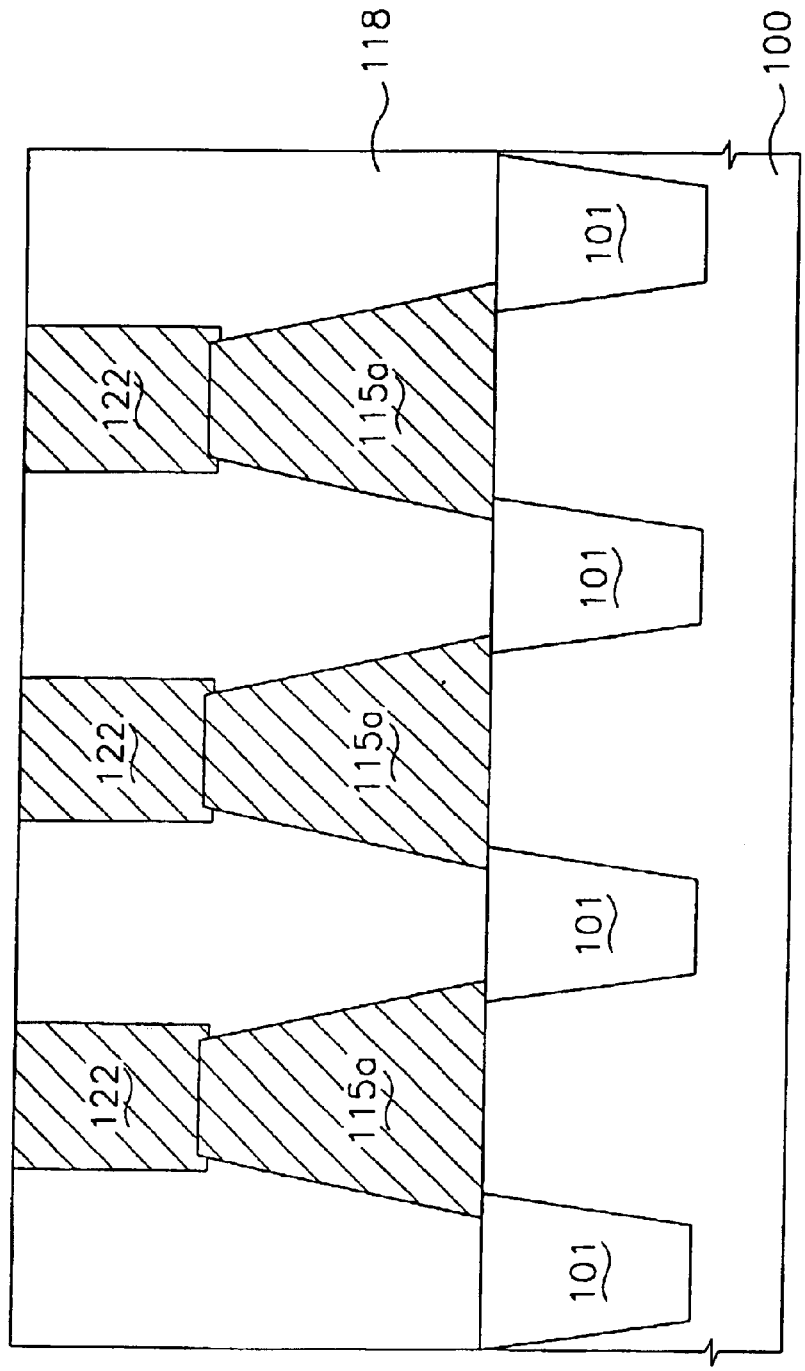

FIGS. 9A and 9B illustrate a step for forming a bit line plug 122. A conductive layer such as a doped polysilicon layer is formed on the bit line contact hole 120 and the second insulating interlayer 118 to a thickness of about 2000 Å. Then, the conductive layer is removed through the etch-back or CMP process until the surface of the second insulating layer 118 is exposed, thereby forming the bit line plug 122 in the bit line contact hole 120.

Figure 10:
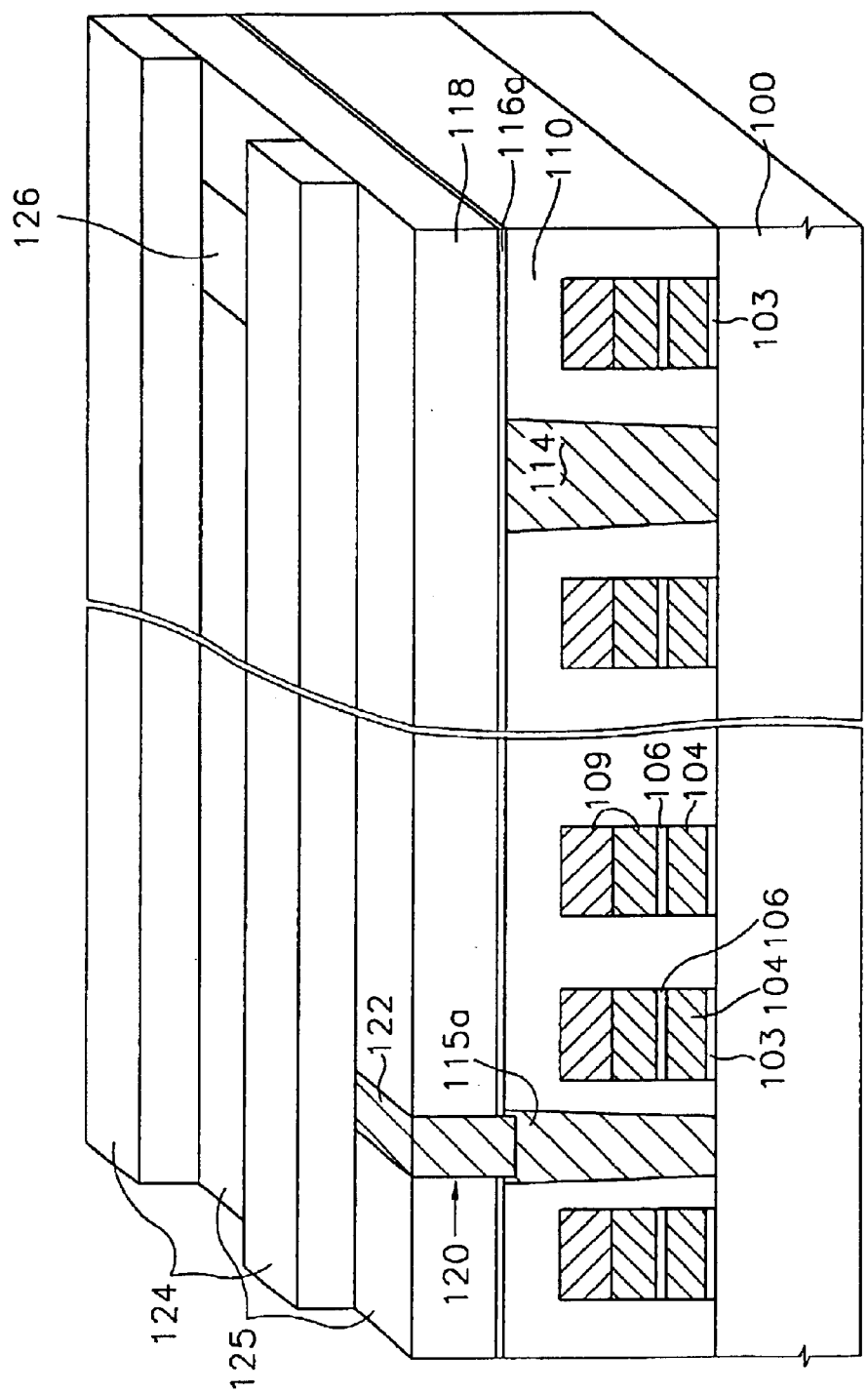
FIG. 10 is a perspective view of a NAND-type flash memory device showing steps for forming a bit line insulating layer and a methal contact hole of a NAND-type flash memory device according to an embodiment of the present invention.

FIG. 10 is a perspective view showing the steps for forming a bit line insulating layer 124 and a metal contact hole 126. SiON is deposited on the bit line plug 122 and the second insulating interlayer 118 to a thickness of about 600 Å through a plasma-enhanced chemical vapor deposition (PE-CVD) process, thereby forming an etch-stopping layer (not shown). Then, an insulating layer such as a TEOS is deposited on the etch-stopping layer to a thickness of about 2000 to 3000 Å through the PE-CVD process. After that, the bit line insulating layer 124 is formed by etching the insulating layer and the etch-stopping layer through the photolithography process. The bit line insulating layer 124 insulates adjacent bit lines from each other and extends in the Y-axial direction, as same as the extending direction of the bit line, while being repeatedly arranged in the X-axial direction. That is, a bit line wiring area 125 is defined between the bit line insulating layers 124.

Then, the second insulating interlayer 118 formed between the bit line insulating layers 124 is partially etched by performing the photolithography process so that the metal contact hole 126 for exposing the common source line 114 is formed. The metal contact hole 126 is formed on the active area positioned at an outer portion of the memory cell and on the gate of the transistor.

Figure 11:
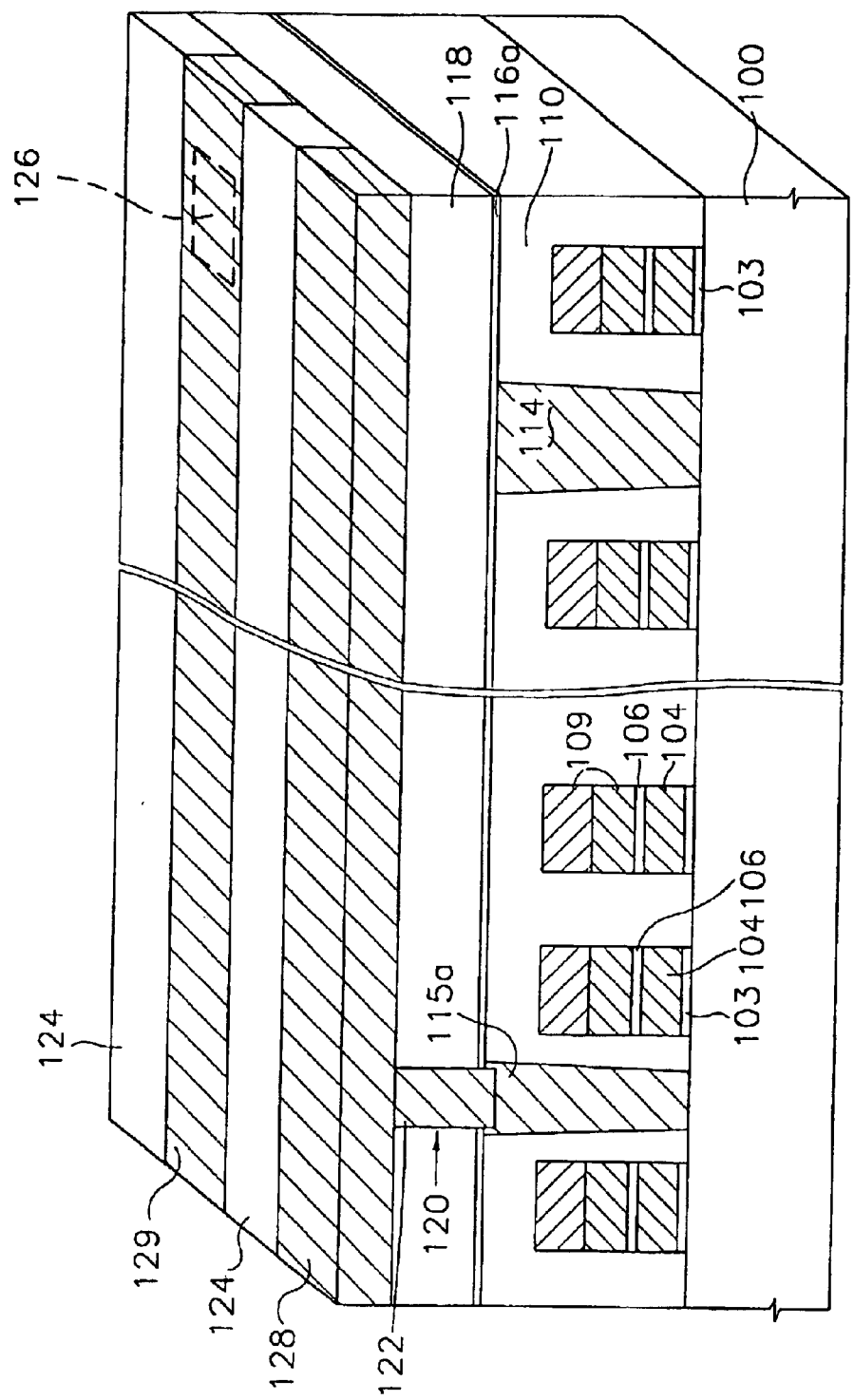
FIG. 11 is a perspective view of a NAND-type flash memory device showing steps for forming a bit line insulating layer and a methal contact hole of a NAND-type flash memory device according to an embodiment of the present invention.

FIG. 11 shows the steps for forming a bit line 128 and a metal wiring layer 129. The resulting structure comprising the metal contact hole 126 is cleaned with a certain chemical for about 60 seconds to remove a natural oxide layer formed on the bit line plug 122. For example, the chemical comprises HF mixed with ultra pure water in a ratio of 1:200. Then, a barrier metal layer (not shown) is sequentially formed on the bit line insulating layer 124, the bit line plug 122, the second insulating interlayer 118 and the metal contact hole 126. For instance, after depositing titanium (Ti) to a thickness of 200 Å through a sputtering process or the CVD process, titanium nitride (TiN) is deposited thereon to a thickness of 500 Å through the sputtering process or the CVD process, thereby forming the barrier metal layer.

A tungsten layer is deposited on the barrier metal layer in a predetermined thickness such that the bit line wiring area 125 and the metal contact hole 126 are sufficiently filled with the tungsten layer. Then, a CMP process is performed to remove the tungsten layer until the surface of the bit line insulating layer 124 is exposed. As a result, the bit line 128 is formed on the bit line wiring area 125, and the metal wiring layer 129 is formed on the metal contact hole 126. The bit line 128 is connected to the active area formed between adjacent sting select lines through the bit line plug 122 and the bit line contact pad 115a. The metal wiring layer 129 is connected to the common source line 114 through the metal contact hole 126 and is connected to the gate of the transistor and to the active area formed at an outer portion of the memory cell.

As mentioned above, according to the first embodiment of the present invention, when the common source line 114 is formed, the pad line 115 extending in the X-axial direction is formed on the area to which the bit line contact hole is formed. Then, the hard mask layer pattern 116a patterned in a same as the active area 102 is formed on the pad line 115. Then, the pad line 115 is etched by using the hard mask layer pattern 116a as an etching mask. As a result, the bit line contact pad 115a is formed only on the active area to which the bit line is connected.

Advantageously, since the bit line contact hole 120 is formed on the bit line contact pad 115a, the misalign margin and an etching margin are ensured when the photolithography process is performed to form the bit line contact hole 120.

Figure 12:
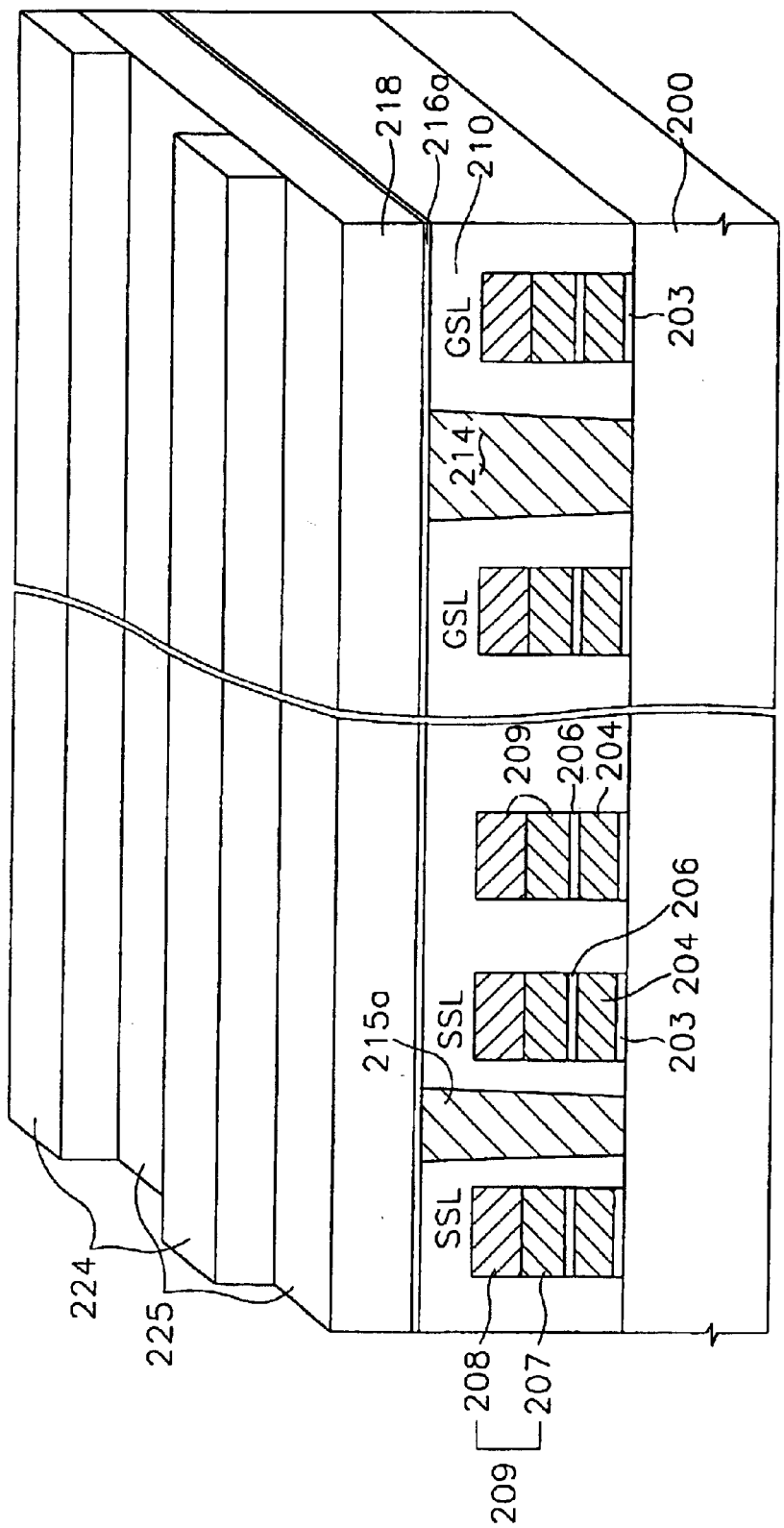
FIGS. 12 to 14 are perspective views of a NAND type flash memory device illustrating a method for constructing a NAND-type flash memory device according to another embodiment of the present invention.
Figure 13:
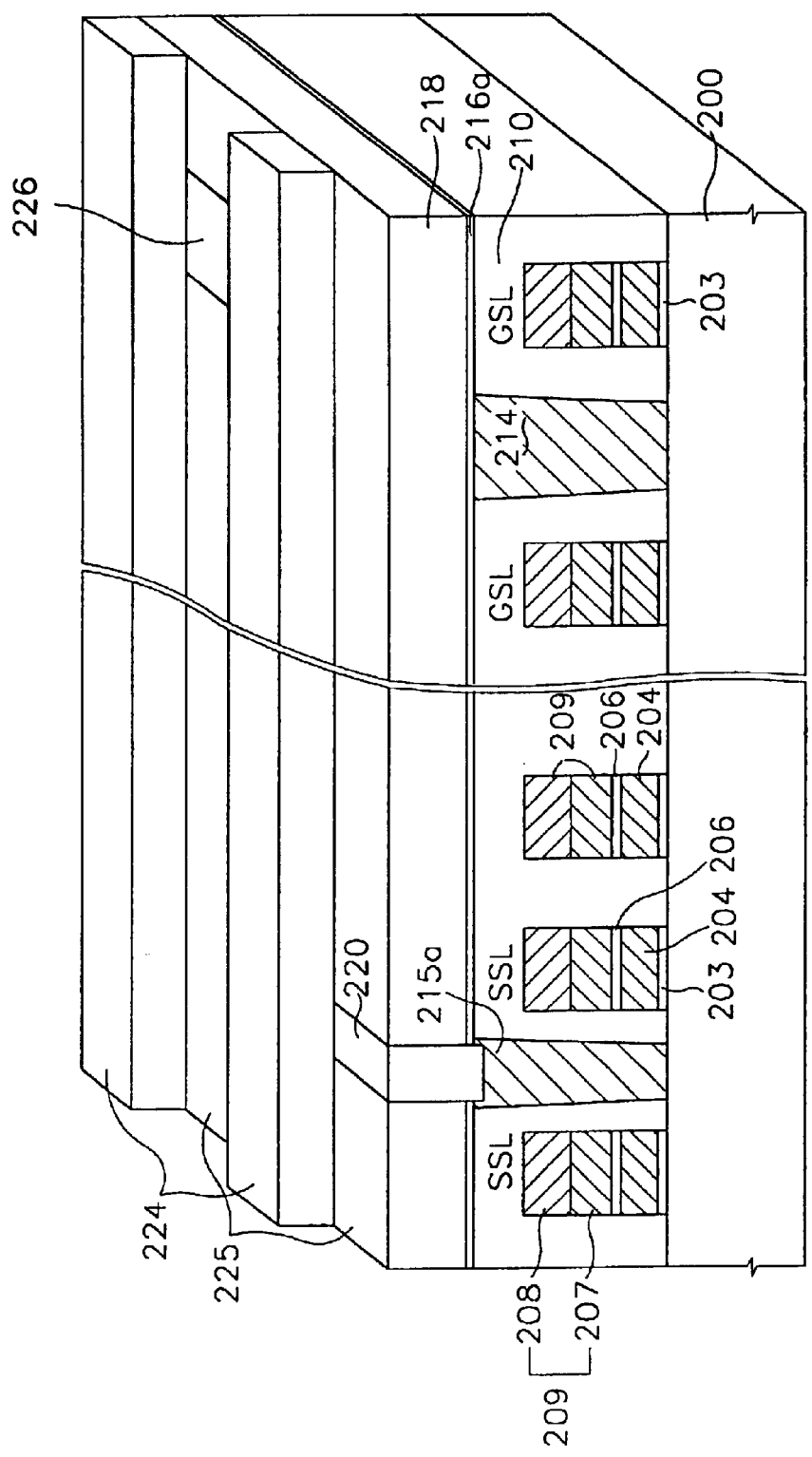
Figure 14:
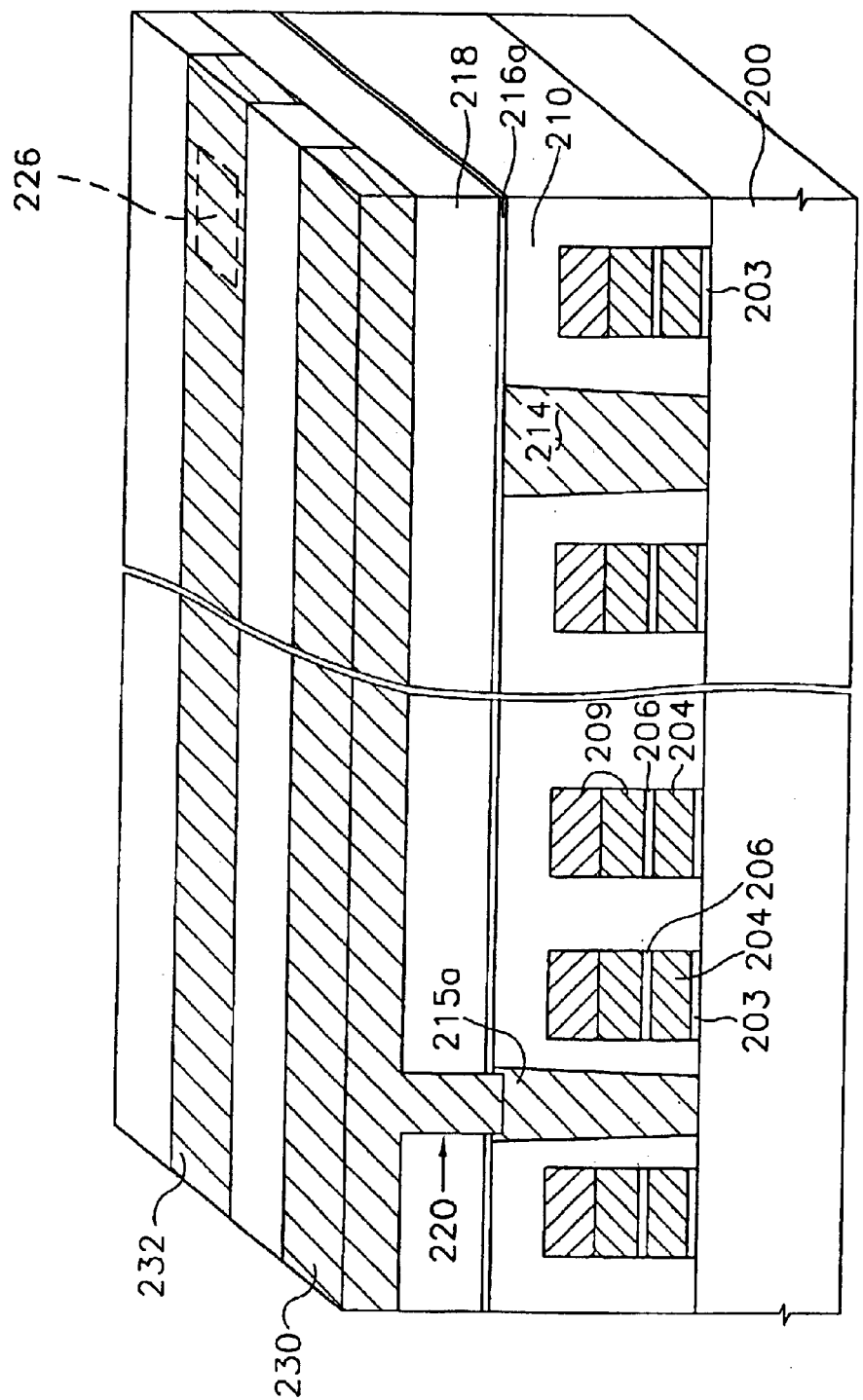

FIGS. 12 to 14 are perspective views of a NAND-type flash memory device for showing the steps of manufacturing a NAND-type flash memory device according to a second embodiment of the present invention. The present embodiment comprises the steps for forming a bit line contact pad identical to those of the first embodiment, so they will not be further described below. Reference numbers 200, 203, 204, 206, 209, 210 and 214 represent a semiconductor substrate, a tunnel oxide layer, a floating gate, a dielectric insulating layer, a control gate, a first insulating interlayer, and a common source line, respectively.

Referring to FIG. 12, a bit line contact pad 215a is formed on the active area positioned between string select lines (SSL) by using a hard mask layer pattern 216a like to the first embodiment. The bit line contact pad 215a comprises a sidewall having a negative slope in the Y-axial direction and a sidewall having a positive slope in the X-axial direction. In addition, the bit line contact pad 215a is overlapped with a predetermined part of the field area in the X-axial direction.

Then, an HDP oxide film is deposited on the hard mask layer pattern 216a and the first interlayer insulating layer 210 to a thickness of about 2000 to 5000 Å such that the gaps between bit line contact pads 215 are completely buried, thereby forming a second insulating interlayer 218.

SiON is deposited on the second insulating interlayer 218 to a thickness of about 600 Å through a plasma-enhanced chemical vapor deposition (PE-CVD) process, thereby forming an etch-stopping layer (not shown). Then, an insulating layer such as a TEOS is deposited on the etch-stopping layer to a thickness of about 2000 to 3000 Å through the PE-CVD process. After that, the insulating layer and the etch-stopping layer are etched through a photolithography process, to thereby form a bit line insulating layer 224. The bit line insulating layer 224 insulates adjacent bit lines from each other and extends in the Y-axial direction (which is the, same as the extending direction of the bit lines), while being repeatedly arranged in the X-axial direction. That is, a bit line wiring area 225 is defined between the bit line insulating layers 224.

Referring to FIG. 13, a bit line contact hole 220 is formed by partially etching the second insulating interlayer 218 formed on the bit line contact pad 215a through the photolithography process. At the same time, the second insulating interlayer 218 formed on the common source line 214 is etched to form a metal contact hole 226. The metal contact hole 226 is formed on the active area positioned at an outer portion of a memory cell and on the gate of a transistor.

Referring to FIG. 14, a barrier metal layer (not shown) comprising Ti/TiN is sequentially formed on the bit line insulating layer 224, the bit line contact hole 220, the second insulating interlayer 218 and the metal contact hole 226. Then, a tungsten layer is deposited on the barrier metal layer to a predetermined thickness such that the bit line wiring area 225, the bit line contact hole 220 and the metal contact hole 226 are sufficiently buried by the tungsten layer. Then, the CMP process is performed to remove the tungsten layer until the surface of the bit line insulating layer 224 is exposed. As a result, a bit line 230 is formed on the bit line contact hole 220 and the bit line wiring area 225, and a metal wiring layer 232 is formed on the metal contact hole 226. The bit line 230 is connected to the active area formed between the sting select lines through the bit line contact pad 215a. The metal wiring layer 232 is connected to the common source line 214 through the metal contact hole 226 and is connected to the gate of the transistor and to the active area formed at an outer portion of the memory cell.

As mentioned above, according to the second embodiment of the present invention, after forming the bit line insulating layer 224, the bit line contact hole 220 for exposing the bit line contact pad 215*a* is simultaneously formed when the lithography process is performed to form the metal contact hole 226. Therefore, the second embodiment can reduce the number of the photolithography processes as compared with the first embodiment, so the manufacturing process can be simplified.

According to preferred embodiments of the present invention, after forming a pad line extending in a X-axial direction on the area to which a bit line contact hole is formed, a hard mask layer pattern (having the same size as the active area) is formed on the pad line when a common source line is formed. Then, the pad line is etched by using the hard mask layer pattern as an etching mask, so that a bit line contact pad is formed only on the active area to which a bit line is connected.

Advantageously, since a bit line contact hole is formed on a bit line contact pad, a misalign margin is ensured when a lithography process is performed to form the bit line contact hole. In addition, when the photolithography process is performed, an etching margin is ensured by the stepped portion of an insulating interlayer.

Although illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A non-volatile memory device comprising:
    a plurality of word lines formed on a semiconductor substrate comprising active areas, wherein the active areas are spaced by field areas and extend in a first direction while being repeatedly arranged in a second direction orthogonal to the first direction, wherein the word lines extend in the second direction while being repeatedly arranged in the first direction;
    a plurality of string select lines that are adjacent to a first word line among the word lines and extend in the second direction and a plurality of ground select lines that are adjacent to a last word line among the word lines and extend in the second direction;
    a first insulating interlayer formed on the word lines, the string select lines, the ground select lines and the semiconductor substrate, wherein said first insulating interlayer comprises a first opening for partially exposing an active area formed between the ground select lines and a second opening for partially exposing an active area formed between the string select lines;
    a bit line contact pad formed in the second opening, a sidewall of the bit line contact pad comprising a negative slope in the first direction and a positive slope in the second direction;
    a hard mask layer pattern formed on the bit line contact pad and the first insulating interlayer, said hard mask pattern comprising a same pattern size as the active area; and
    a second insulating interlayer formed on the hard mask layer pattern and the first insulating interlayer, said second insulating interlayer comprising a bit line contact hole for exposing the bit line contact pad.

2. The non-volatile memory device as claimed in claim 1, further comprising a common source line formed in the first opening, said common source line extending in the second direction.

3. The non-volatile memory device as claimed in claim 1, wherein the bit line contact pad is planarized to have a same height as the first insulating interlayer.

4. The non-volatile memory device as claimed in claim 1, wherein the bit line contact pad is overlapped with a predetermined part of the field areas in the second direction.

5. The non-volatile memory device as claimed in claim 1, further comprising a plurality of bit lines formed on the second insulating interlayer, wherein each bit line extends in the first direction while being repeatedly arranged in the second direction, and connects to the active area formed between the string select lines through the bit line contact hole and the bit line contact pad.

6. The non-volatile memory device as claimed in claim 1, wherein the bit line contact pad comprises doped polysilicon.

7. The non-volatile memory device as claimed in claim 1, wherein the hard mask layer pattern comprises one of a nitride based film, an oxide based film, and a composite film of the nitride based film and the oxide based film.

* * * * *